US009111610B2

(12) United States Patent
Katayama et al.

(10) Patent No.: US 9,111,610 B2
(45) Date of Patent: Aug. 18, 2015

(54) METHOD OF DRIVING NONVOLATILE MEMORY ELEMENT AND NONVOLATILE MEMORY DEVICE

(71) Applicant: Panasonic Corporation, Osaka (JP)

(72) Inventors: Koji Katayama, Nara (JP); Satoru Mitani, Osaka (JP); Shunsaku Muraoka, Osaka (JP); Zhiqiang Wei, Osaka (JP); Takeshi Takagi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/127,750

(22) PCT Filed: Apr. 17, 2013

(86) PCT No.: PCT/JP2013/002607
§ 371 (c)(1),
(2) Date: Dec. 19, 2013

(87) PCT Pub. No.: WO2013/157261
PCT Pub. Date: Oct. 24, 2013

(65) Prior Publication Data
US 2014/0126268 A1     May 8, 2014

(30) Foreign Application Priority Data

Apr. 20, 2012   (JP) ................................. 2012-097093

(51) Int. Cl.
*G11C 11/00* (2006.01)
*G11C 13/00* (2006.01)

(52) U.S. Cl.
CPC ........ *G11C 13/0007* (2013.01); *G11C 13/0064* (2013.01); *G11C 13/0069* (2013.01); *G11C 13/004* (2013.01); *G11C 2213/72* (2013.01); *G11C 2213/79* (2013.01)

(58) Field of Classification Search
CPC .......................... G11C 11/161; G11C 13/0069
USPC .................................................. 365/148, 158
See application file for complete search history.

(56) References Cited

U.S. PATENT DOCUMENTS 6,204,139 B1   3/2001   Liu et al.
6,995,999 B2   2/2006   Morimoto
(Continued)

FOREIGN PATENT DOCUMENTS

JP   2004-363604   12/2004
JP   2005-25914    1/2005
(Continued)

OTHER PUBLICATIONS

International Search Report issued Jun. 4, 2013 in International Application No. PCT/JP2013/002607.

*Primary Examiner* — Michael Tran
(74) *Attorney, Agent, or Firm* — Wenderoth, Lind & Ponack, L.L.P.

(57) ABSTRACT

A method of driving a nonvolatile memory element including a variable resistance element having a state reversibly changing between low and high resistance states by an applied electrical signal and a transistor serially connected to the variable resistance element. The method including: setting the variable resistance element to the low resistance state by applying a first gate voltage to a gate of the transistor and applying a first write voltage negative with respect to a first electrode; and changing a resistance value of the transistor obtained in a low-resistance write operation, when a value of current passing through the variable resistance element in the setting of the low resistance state or a resistance value of the nonvolatile memory element in the case where the variable resistance element is in the low resistance state is outside a predetermined range.

21 Claims, 16 Drawing Sheets

(56) References Cited

U.S. PATENT DOCUMENTS

| | | |
|---|---|---|
| 7,145,791 B2 | 12/2006 | Tsushima et al. |
| 8,022,502 B2 * | 9/2011 | Kanzawa et al. ............. 257/529 |
| 8,058,636 B2 | 11/2011 | Osano et al. |
| 8,101,983 B2 | 1/2012 | Seo et al. |
| 8,164,130 B2 | 4/2012 | Seo et al. |
| 8,217,489 B2 | 7/2012 | Osano et al. |
| 8,295,074 B2 | 10/2012 | Yasuda et al. |
| 8,345,465 B2 | 1/2013 | Muraoka et al. |
| 8,395,925 B2 | 3/2013 | Kawai et al. |
| 8,406,035 B2 | 3/2013 | Katoh et al. |
| 8,492,875 B2 | 7/2013 | Osano et al. |
| 8,531,869 B2 | 9/2013 | Katoh et al. |
| 2004/0245557 A1 | 12/2004 | Seo et al. |
| 2004/0264244 A1 | 12/2004 | Morimoto |
| 2005/0174854 A1 | 8/2005 | Tsushima et al. |
| 2007/0008770 A1 | 1/2007 | Nagao et al. |
| 2007/0114587 A1 | 5/2007 | Seo et al. |
| 2008/0123393 A1 | 5/2008 | Kinoshita |
| 2009/0250678 A1 | 10/2009 | Osano et al. |
| 2010/0259967 A1 | 10/2010 | Yasuda et al. |
| 2010/0271860 A1 | 10/2010 | Muraoka et al. |
| 2011/0128776 A1 | 6/2011 | Katoh et al. |
| 2012/0069626 A1 | 3/2012 | Nakano et al. |
| 2012/0069633 A1 | 3/2012 | Katoh |
| 2012/0074369 A1 | 3/2012 | Osano et al. |
| 2012/0120712 A1 | 5/2012 | Kawai et al. |
| 2012/0235111 A1 | 9/2012 | Osano et al. |
| 2012/0292589 A1 * | 11/2012 | Yoneda et al. ................... 257/4 |
| 2013/0208531 A1 | 8/2013 | Katoh et al. |

FOREIGN PATENT DOCUMENTS

| | | |
|---|---|---|
| JP | 2005-216387 | 8/2005 |
| JP | 2007-18615 | 1/2007 |
| JP | 2009-135206 | 6/2009 |
| JP | 4485605 | 6/2010 |
| JP | 4705202 | 6/2011 |
| JP | 2012-64283 | 3/2012 |
| WO | 2006/137111 | 12/2006 |
| WO | 2008/126365 | 10/2008 |
| WO | 2010/131477 | 11/2010 |
| WO | 2011/121971 | 10/2011 |

* cited by examiner

-3.3 V

-4.0 V

-7.0 V

-10.0 V

METHOD OF DRIVING NONVOLATILE MEMORY ELEMENT AND NONVOLATILE MEMORY DEVICE

TECHNICAL FIELD

The present invention relates to methods of driving nonvolatile memory elements including variable resistance elements. In particular, the present invention relates to a method of driving a nonvolatile memory element including: a variable resistance element that reversibly changes in the resistance state in response to an applied electrical signal; and a transistor connected in series with the variable resistance element, and to a nonvolatile memory device including the nonvolatile memory element.

BACKGROUND ART

In recent years, with the advances in digital technologies employed for electronic apparatuses, the amount of data on music, images, information, and the like has increased. On this account, large-capacity and nonvolatile memory devices for storing such data are in increasing demand. As one of the measures to respond to this demand, a variable resistance nonvolatile memory device (referred to as the "ReRAM" hereafter) which includes a memory cell having a variable resistance element (nonvolatile memory element) that has a resistance value reversibly changing in response to a given electrical signal and keeps the resulting state even after power-off has received attention. Examples of the reasons for the attention include that the configuration of the nonvolatile memory element is relatively simple and thus implemented easily at a high density, and that consistency with a conventional semiconductor process can be easily ensured.

In general, a variable resistance element includes a variable resistance layer positioned between a pair of electrodes, and is classified roughly into two kinds according to a material used for the variable resistance layer (a variable resistance material). One kind is a variable resistance element which includes a perovskite material (such as $Pr_{(1-x)}Ca_xMnO_3$ (PCMO), $La_{(1-x)}Sr_xMnO_3$ (LSMO), or $GdBaCo_xO_y$ (GBCO)) as the variable resistance material, as disclosed in Patent Literature 1 (PTL 1) for example.

The other kind is a variable resistance element which includes a binary transition metal oxide as the variable resistance material, as disclosed in Patent Literature 2 (PTL 2) for example. As compared with the aforementioned perovskite material, the composition and structure of the binary transition metal oxide are extremely simple. On account of this, the composition control and film formation at the time of manufacturing can be easily implemented. In addition, because of the advantage of relatively excellent consistency with the semiconductor manufacturing process, a great deal of research have been conducted in recent years.

CITATION LIST

Patent Literature

[PTL 1]
The specification of U.S. Pat. No. 6,204,139
[PTL 2]
Japanese Unexamined Patent Application Publication No. 2004-363604

SUMMARY OF INVENTION

Technical Problem

It is desired for a nonvolatile memory element including a variable resistance element to improve the stability in the characteristics (endurance characteristics) even when a writing process is performed multiple times. However, a nonvolatile memory element including a conventional variable resistance element cannot achieve desired endurance characteristics in some cases.

The present invention is conceived to solve the aforementioned problem, and has an object to provide a method of driving a nonvolatile memory element capable of improving the endurance characteristics and a nonvolatile memory device including the nonvolatile memory element.

Solution to Problem

In order to achieve the aforementioned object, a method of driving a nonvolatile memory element in an aspect according to the present invention is a method of driving a nonvolatile memory element which includes a variable resistance element and a current steering element, the variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer, the current steering element having a transistor connected in series with the variable resistance element, and the method including: setting the variable resistance element to a low resistance state by applying a first gate voltage to a gate of the transistor and applying a first write voltage having a first polarity to the nonvolatile memory element; setting the variable resistance element to a high resistance state by applying a second gate voltage to the gate of the transistor and applying, to the nonvolatile memory element, a second write voltage having a second polarity different from the first polarity; and changing a resistance value of the transistor that is obtained in the setting of a low resistance state, when a value of current passing through the variable resistance element in the low resistance state or a resistance value of the nonvolatile memory element in a case where the variable resistance element is in the low resistance state is outside a predetermined range.

Advantageous Effects of Invention

With the above method of driving the nonvolatile memory element, the endurance characteristics can be improved.

BRIEF DESCRIPTION OF DRAWINGS

FIG. 1A is a circuit diagram showing a configuration of a nonvolatile memory element that includes a variable resistance element and a current steering element.
FIG. 1B is a circuit diagram showing a configuration of a nonvolatile memory element that includes a variable resistance element and a current steering element.
FIG. 2 is a block diagram showing a configuration of the variable resistance element.

FIG. 3A shows an image obtained by the electron beam absorbed current (EBAC) analysis on a local region formed by an initial breakdown operation performed on the variable resistance element after manufacture.

FIG. 3B shows an image obtained by the EBAC analysis on the local region formed by the initial breakdown operation performed on the variable resistance element after manufacture.

FIG. 3C shows an image obtained by the EBAC analysis on the local region formed by the initial breakdown operation performed on the variable resistance element after manufacture.

FIG. 3D shows an image obtained by the EBAC analysis on the local region formed by the initial breakdown operation performed on the variable resistance element after manufacture.

FIG. 4 is a graph showing a relationship between the initial breakdown voltage applied to the variable resistance element and the diameter of the local region.

FIG. 5 is a graph showing resistance changes when the initial breakdown operation and a normal operation (a resistance change operation) are performed on the nonvolatile memory element.

FIG. 6 is a graph showing endurance characteristics of the nonvolatile memory element.

FIG. 7 is a graph showing current-voltage (I-V) characteristics of the nonvolatile memory element.

FIG. 8 is a graph showing I-V characteristics of the variable resistance element alone that is included in the nonvolatile memory element and also showing a load curve at the end of a low-resistance write operation.

FIG. 9 is a graph showing I-V characteristics of a second local region included in the variable resistance element and also showing load curves obtained at the end of a low-resistance write operation and in a read operation.

FIG. 10A is a graph showing a relationship between the number of executions of a resistance change operation and the read current.

FIG. 10B is a graph showing a relationship between the number of executions of the resistance change operation and the write current.

FIG. 10C is a graph showing a relationship between the number of executions of the resistance change operation and the resistance value of a base resistance.

FIG. 11A is a graph showing a relationship between the number of executions of the resistance change operation and the read current.

FIG. 11B is a graph showing a relationship between the number of executions of the resistance change operation and the write current.

FIG. 11C is a graph showing a relationship between the number of executions of the resistance change operation and the resistance value of the base resistance.

FIG. 12A is a graph showing a relationship between the number of executions of the resistance change operation and the read current.

FIG. 12B is a graph showing a relationship between the number of executions of the resistance change operation and the write current.

FIG. 12C is a graph showing a relationship between the number of executions of the resistance change operation and the resistance value of the base resistance.

FIG. 13 is a graph showing operating points of the second local region of the variable resistance element in Embodiment.

FIG. 14 is a flowchart showing a method of driving the nonvolatile memory element in Embodiment.

FIG. 15 is a flowchart showing a method of driving the nonvolatile memory element in Embodiment.

FIG. 16 is a flowchart showing a method of driving the nonvolatile memory element in Embodiment.

FIG. 17 is a flowchart showing a method of driving the nonvolatile memory element in Embodiment.

FIG. 18 is a flowchart showing a method of driving the nonvolatile memory element in Embodiment.

FIG. 19 is a block diagram showing an example of a configuration of a nonvolatile memory device in Embodiment.

FIG. 20 is a block diagram showing an example of a configuration of a nonvolatile memory device in Embodiment.

DESCRIPTION OF EMBODIMENTS

[Circumstances Leading to Present Invention]

Figure 1A:
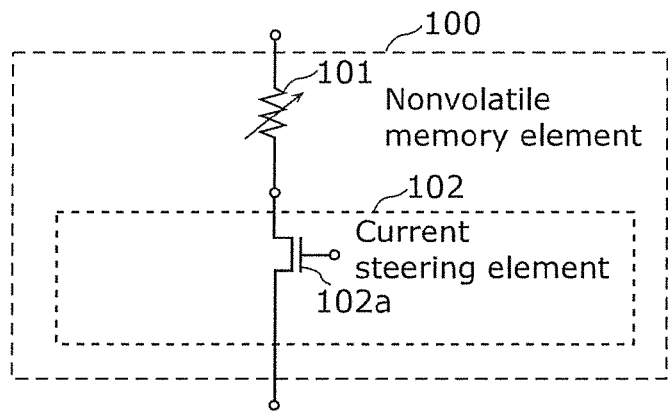
[FIG. 1A]

In general, data is written into a nonvolatile memory element including a variable resistance element by the following steps. Firstly, a write voltage is applied to the nonvolatile memory element. The write voltage refers to a low-resistance write voltage applied in a low-resistance write operation to change the variable resistance element to a low resistance state, or refers to a high-resistance write voltage applied in a high-resistance write operation to change the variable resistance element to a high resistance state. After this, the data is read from the nonvolatile memory element to perform a process of determining whether or not a resistance value is within a predetermined range. As a result, when it is determined that the resistance value is not within the predetermined range, an additional writing process is performed. In this process, the write voltage is applied while the number of voltage applications, the voltage value, the pulse width, and the like are gradually changed. The determination process and the additional writing process are repeated until the resistance value falls within the predetermined range.

As described above, it is desired for the nonvolatile memory element including the variable resistance element to improve the endurance characteristics. In view of this, the present inventors and others studied the relationship between the change caused in the structure of the nonvolatile memory element by multiple data rewrites and the endurance characteristics.

Although the details are described later, the present inventors measured the endurance characteristics of the variable resistance element having the structure that the present inventors are currently studying. It was found, from the result of the measurement, that as the repeat count of the writing process increases, the read current in the low resistance state is reduced (degradation behavior). It is assumed that the reduction in the read current results from the gradual changes in the structure of the variable resistance element due to the executions of the writing process, instead of from a sudden write error. Thus, when the additional writing process is performed to stabilize the data, problems may arise as the number of executions of the additional writing process increases. The problems include that the number of executions of the additional writing process increases and that the resistance value does not fall within the predetermined range by the additional writing process.

The method of driving the nonvolatile memory element in the following various embodiments according to the present invention is based on the above-described circumstances and idea.

[Aspect of Method of Driving Nonvolatile Memory Element]

The method of driving the nonvolatile memory element in an aspect according to the present invention is a method of driving a nonvolatile memory element which includes a variable resistance element and a current steering element, the variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer, the current steering element having a transistor connected in series with the variable resistance element, and the method including: setting the variable resistance element to a low resistance state by applying a first gate voltage to a gate of the transistor and applying a first write voltage having a first polarity to the nonvolatile memory element; setting the variable resistance element to a high resistance state by applying a second gate voltage to the gate of the transistor and applying, to the nonvolatile memory element, a second write voltage having a second polarity different from the first polarity; and changing a resistance value of the transistor that is obtained in the setting of a low resistance state, when a value of current passing through the variable resistance element in the low resistance state or a resistance value of the nonvolatile memory element in a case where the variable resistance element is in the low resistance state is outside a predetermined range.

With the method of driving the nonvolatile memory element according to the present invention, even when the repeat count increases and the structure of the variable resistance element changes, an appropriate drive voltage can be determined from the read resistance value. Alternatively, by the feedback of the read resistance value as appropriate, the driving condition can be determined to maintain the structure of the variable resistance element stably within a certain range even when the repeat count increases.

Accordingly, this driving method can implement the excellent endurance characteristics.

It should be noted that each of "the first polarity" and "the second polarity" mentioned here is defined by the corresponding positive or negative potential of the second electrode with respect the potential of the first electrode. Moreover, the second electrode is located "above" only with respect to the first electrode. Thus, the vertical direction indicated here is not necessarily the same as the vertical direction based on the layer-stacking direction with respect to a semiconductor substrate. Furthermore, the changing may be performed in the setting some or all of the variable resistance elements to the low resistance state or may be performed at any timing.

Moreover, for example, the method of driving the nonvolatile memory element may further include reading a resistance value of the variable resistance element from a read current passing through the variable resistance element, by applying a read voltage to the variable resistance element after the setting of a low resistance state is performed, wherein the changing may include determining whether or not the resistance value read in the reading is outside the predetermined range.

Furthermore, for example, in the determining, whether or not an amount of change in the resistance value of the variable resistance element is outside the predetermined range may be determined.

Moreover, for example, the reading and the determining may be performed after the setting of a low resistance state is performed a predetermined number of times.

Furthermore, for example, the determining may further include calculating an amount of change in the resistance value of the variable resistance element by comparing the resistance value read in the reading with a resistance value previously read in the reading performed before.

Moreover, for example, the determining may further include calculating the amount of change in the resistance value of the variable resistance element by comparing the resistance value read in the reading with a reference resistance value.

Furthermore, for example, in the changing, the resistance value of the transistor may be changed according to the resistance value read in the reading.

Moreover, for example, when (i) the variable resistance element further includes a local region having an outer surface that is in contact with only the second electrode, the first oxide layer, and the second oxide layer and (ii) the local region includes a first local region and a second local region, the first local region comprising a third metal oxide that is higher in the oxygen deficiency level than the first metal oxide, and the second local region being formed in an area having a surface that is in contact with the second electrode and comprising a fourth metal oxide that is higher in the oxygen deficiency level than the second metal oxide and lower in the oxygen deficiency level than the third metal oxide, the method may further include reading a resistance value of the variable resistance element from a read current passing through the variable resistance element, by applying a read voltage to the variable resistance element after the setting of a low resistance state is performed, and in the changing, a base resistance including a resistance of the first local region and a resistance of the first oxide layer may be calculated based on the resistance value read in the reading, and the resistance value of the transistor may be changed according to the calculated base resistance.

Furthermore, for example, the method of driving the nonvolatile memory element may further include reading a current value of a low-resistance write current passing through the variable resistance element, the reading being performed together with the setting of a low resistance state, wherein the changing may include determining whether or not the current value read in the reading is outside a predetermined range.

Moreover, for example, in the determining, whether or not an amount of change in the current value read in the reading is outside the predetermined range may be determined.

Furthermore, for example, the reading and the determining may be performed after the setting of a low resistance state is performed a predetermined number of times.

Moreover, for example, the determining may further include calculating an amount of change in the current value by comparing the current value read in the reading with a current value previously read in the reading performed before.

Furthermore, for example, the determining may further include calculating the amount of change in the current value by comparing the current value read in the reading with a reference current value.

Moreover, for example, in the changing, the resistance value of the transistor may be changed according to the current value read in the reading.

Furthermore, for example, in the changing, the resistance value of the transistor may be changed according to a correlation stored in advance, the correlation being between (i) the value of the current passing through the variable resistance element in the low resistance state or the resistance value of the nonvolatile memory element in the case where the variable resistance element is in the low resistance state and (ii) the resistance value of the transistor.

Moreover, for example, in the changing, the resistance value of the transistor may be changed to cause the value of the current passing through the variable resistance element in the low resistance state or the resistance value of the nonvolatile memory element in the case where the variable resistance element is in the low resistance state to approach the predetermined range.

Furthermore, for example, the changing may be performed after the setting of a low resistance state is performed a predetermined number of times.

Moreover, for example, in the changing, the resistance value of the transistor may be changed by changing the first gate voltage.

Furthermore, for example, a second metal included in the second metal oxide and a first metal included in the first metal oxide may be the same kind of metal.

Moreover, for example, each of the first metal and the second metal may be tantalum (Ta).

Furthermore, for example, the current steering element may include a diode and a fixed resistor at least one of which is connected in series with the transistor.

The nonvolatile memory device in an aspect according to the present invention is a nonvolatile memory device including: a variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer; a current steering element having a transistor connected in series with the variable resistance element; a write voltage application circuit which executes (i) a low-resistance write operation by applying a first gate voltage to a gate of the transistor and applying a first write voltage having a first polarity to the nonvolatile memory element and (ii) a high-resistance write operation by applying a second gate voltage to the gate of the transistor and applying, to the nonvolatile memory element, a second write voltage having a second polarity different from the first polarity; and a control circuit which changes a resistance value of the transistor that is obtained in the low-resistance write operation, when a value of current passing through the variable resistance element in the low resistance state or a resistance value of the nonvolatile memory element in a case where the variable resistance element is in the low resistance state is outside a predetermined range.

[Explanation of Terms and the Like]

The term "oxygen deficiency level" refers to a proportion of deficient oxygen to the amount of oxygen included in an oxide that has a stoichiometric composition (a stoichiometric composition having the highest resistance value in the case where a plurality of stoichiometric compositions are present) in a metal oxide. The metal oxide having the stoichiometric composition has a more stable and higher resistance value as compared with a metal oxide having a different composition.

For example, when the metal is tantalum (Ta), the oxide having the stoichiometric composition based on the above definition is $Ta_2O_5$ and thus can be expressed by $TaO_{2.5}$. The oxygen deficiency level of $TaO_{2.5}$ is 0%, and the oxygen deficiency level of $TaO_{1.5}$ is calculated as $(2.5-1.5)/2.5=40\%$. Here, the oxygen deficiency level of an oxygen-rich metal oxide is a negative value. Unless otherwise specified, the present description explains the oxygen deficiency level, assuming that each of a positive value, 0, and a negative value may represent the oxygen deficiency level.

The oxide having a low oxygen deficiency level has a high resistance value since the oxide is closer to the oxide having the stoichiometric composition. The oxide having a higher oxygen deficiency level has a lower resistance value since the oxide is closer to the metal included in the oxide.

Here, the "oxygen content atomic percentage" refers to the percentage of the number of oxygen atoms to the total number of atoms. For example, the oxygen content atomic percentage of $Ta_2O_5$ is the percentage of oxygen atoms to the total number of atoms (i.e., O/(Ta+O)), and thus is 71.4 atm %. Therefore, the oxygen content atomic percentage of the oxygen-deficient tantalum oxide is higher than 0 atm % and lower than 71.4 atm %. For example, when a metal included in a first metal oxide layer and a metal included in a second metal oxide layer are of the same kind, the oxygen content atomic percentage and the oxygen deficiency level have a correlation. To be more specific, when the oxygen content atomic percentage of the second metal oxide is higher than that of the first metal oxide, the oxygen deficiency level of the second metal oxide is lower than that of the first metal oxide.

The term "oxygen-deficient metal oxide" refers to an oxide having a lower oxygen content atomic percentage (atom ratio: the percentage of the number of oxygen atoms to the total number of atoms) as compared with an oxide having a stoichiometric composition. In general, the oxide having a stoichiometric composition has an insulator or an extremely high resistance value. For example, when the transition metal is Ta, the composition of the stoichiometric oxide is expressed as $Ta_2O_5$ and thus the ratio between Ta and O in atomic count (O/Ta) is 2.5. Therefore, the atom ratio between Ta and O of the oxygen-deficient Ta oxide is larger than 0 and smaller than 2.5. In the present embodiment, the oxygen-deficient transition metal oxide may be an oxygen-deficient Ta oxide. Moreover, the variable resistance layer may include at least a stacked structure in which a first tantalum-containing layer having a composition expressed as $TaO_x$ (where $0<x<2.5$) and a second tantalum-containing layer having a composition expressed as $TaO_y$ (where $x<y$) are stacked. Another layer, such as a third tantalum-containing layer or a different transition metal oxide layer, may be arranged as necessary. Here, in order for the variable resistance element to implement a stable operation, $TaO_x$ may satisfy $0.8 \leq x \leq 1.9$ and $TaO_y$ may satisfy 2.1≤y≤2.5. The thickness of the second tantalum-containing layer may be at least 1 nm and no more than 8 nm.

The term "metal oxide having a stoichiometric composition" refers to a metal oxide having the oxygen deficiency level of 0%. For example, in the case of the tantalum oxide, the metal oxide having the stoichiometric composition is $Ta_2O_5$ which is an insulator. Here, when the metal oxide has the oxygen deficiency level of 0%, this means that this metal oxide is an insulator. However, an oxygen-deficient type of metal oxide is conductive. The metal oxide having a low oxygen deficiency level has a higher resistance value since the oxide is closer to the metal oxide of the stoichiometric composition. The oxide having a higher oxygen deficiency level has a lower resistance value since the oxide is closer to the metal included in the metal oxide. To be more specific, when the metal is tantalum (Ta), the composition of the stoichiometric oxide of the metal oxide is $Ta_2O_5$ and thus can be expressed by $TaO_{2.5}$. The oxygen deficiency level of $TaO_{2.5}$ is 0%. For example, the oxygen deficiency level of the oxygen-deficient tantalum oxide having the composition of $TaO_{1.5}$ is calculated as (2.5−1.5)/2.5=40%. Here, as mentioned above, the oxygen content atomic percentage refers to the percentage of the number of oxygen atoms to the total number of atoms included in the metal oxide. The oxygen content atomic percentage of $Ta_2O_5$ is the percentage of the number of oxygen atoms to the total number of atoms (i.e., O/(Ta+O)), and thus is 71.4 atm %. Therefore, the oxygen content atomic percentage of the oxygen-deficient tantalum oxide is higher than 0 atm % and lower than 71.4 atm %. It should be noted that when a metal included in a first metal oxide layer and a metal included in a second metal oxide layer are of the same kind, a magnitude relationship in the oxygen deficiency level can be restated using the term "oxygen content atomic percentage". A "high oxygen content atomic percentage" means a "low oxygen deficiency level". A "low oxygen content atomic percentage" means a "high oxygen deficiency level". For example, when the oxygen deficiency level of the first metal oxide is higher than that of the second metal oxide, the oxygen content atomic percentage of the first metal oxide is lower than that of the second first metal oxide.

In general, a "standard electrode potential" is one indicator that indicates the susceptibility to oxidation. When the value of the standard electrode potential is larger, this means that the present material is less susceptible to oxidation. When the value of the standard electrode potential is smaller, this means that the present material is more susceptible to oxidation. It should be noted that when a difference in the standard electrode potential between the electrode and the oxygen-deficient layer having a low oxygen deficiency level (the second oxide layer) is larger, it is easier for an oxidation-reduction reaction to occur. This in turn makes it easier for a resistance change to occur. Moreover, as the difference in the standard electrode potential is reduced, it is harder for the oxidation-reduction reaction to occur, which in turn makes it harder for a resistance change to occur. This leads to the assumption that the susceptibility to oxidation plays a significant role in the mechanism of a resistance change phenomenon.

The term "insulator" follows the general definition. To be more specific, the insulator comprises a material having a resistivity of $10^8$ Ωcm or more. On the other hand, a "conductor" comprises a material having a resistivity less than $10^8$ Ωcm.

The following is a detailed description of embodiments according to the present invention, with reference to the drawings. It should be noted that each of the embodiments below describes only a preferred specific example. Note that numerical values, shapes, materials, structural elements, arrangement and connection of the structural elements, steps, the processing order of the steps, and so forth described in the embodiments below are mere examples and therefore are not intended to limit the present invention. Therefore, among the structural elements in the following exemplary embodiments, structural elements not cited in any one of the independent claims are described as arbitrary structural elements. Moreover, the description on the structural elements having the same reference sign in the drawings may not be repeated. Furthermore, each of the structural elements is schematically illustrated in the drawings for ease of comprehension. Therefore, the shapes and dimensional ratio thereof may not be accurately illustrated in the drawings. Moreover, in the manufacturing method, the processing order of the steps or the like can be changed, or a well-known step can be added, as necessary.

[Embodiment 1]

Firstly, a method of driving a nonvolatile memory element including a variable resistance element in Embodiment 1 is described, with reference to FIG. 1A and FIG. 2 to FIG. 19.

[1-1. Configuration of Nonvolatile Memory Element]

Figure 2:
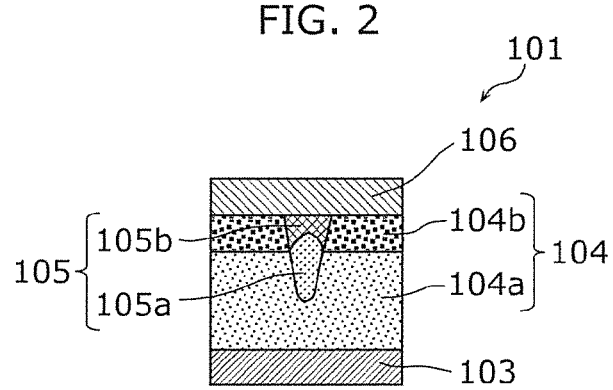
[FIG. 2]
Figure 3A:
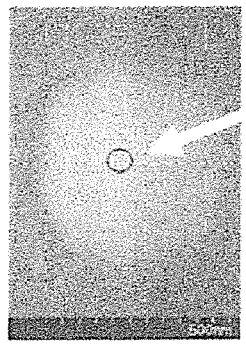
[FIG. 3A]
Figure 3B:
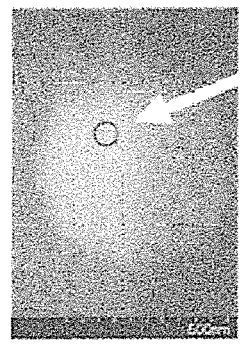
[FIG. 3B]
Figure 3C:
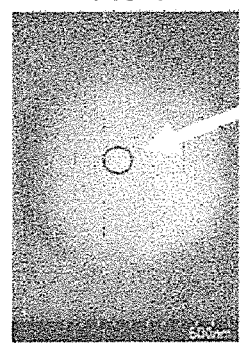
[FIG. 3C]
Figure 3D:
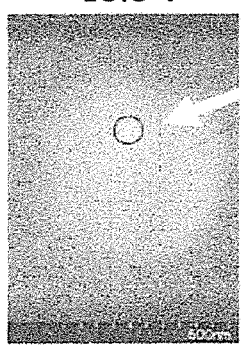
[FIG. 3D]

An example of a configuration of a nonvolatile memory element 100 driven according to the method of driving the nonvolatile memory element in the present embodiment is firstly described with reference to FIG. 1A and FIG. 2. FIG. 1A is a circuit diagram showing the configuration of the nonvolatile memory element 100. FIG. 2 is a block diagram showing a configuration of the variable resistance element.

As shown in FIG. 1A, the nonvolatile memory element 100 includes a variable resistance element 101 and a current steering element 102 that are connected in series.

The current steering element 102 includes a transistor 102a as shown in FIG. 1A in the present embodiment. The current steering element 102 is capable of controlling a gate voltage of the transistor 102a to control a voltage applied to the variable resistance element 101 and a current passing through the variable resistance element 101.

As shown in FIG. 2, the variable resistance element 101 includes a first electrode 103, a second electrode 106, and a variable resistance layer 104 positioned between the first electrode 103 and the second electrode 106. More specifically, the variable resistance element 101 includes the first electrode 103, the variable resistance layer arranged on the first electrode 103, and the second electrode 106 arranged on the variable resistance layer 104.

The first electrode 103 may comprise a material, such as Ta (tantalum), TaN (tantalum nitride), Ti (titanium), TiN (titanium nitride), or TiAlN (titanium aluminum nitride), that has a standard electrode potential lower than a standard electrode potential of a material included in the second electrode 106 described later.

The second electrode 106 may comprise a material, such as Pt (platinum), Ir (iridium), or Pd (palladium), that has a standard electrode potential higher than a standard electrode potential of a metal that is included in a second oxide layer 104b included in the variable resistance layer 104 described later. Since each of the materials of the first electrode 103 and the second electrode 106 is selected in this way, stable variable resistance characteristics can be obtained.

The variable resistance layer 104 reversibly changes between a high resistance state and a low resistance state according to the opposite polarities of a voltage pulse applied between the first electrode 103 and the second electrode 106. It should be noted that, in the present description, the wording "the variable resistance element 101 is in the high resistance state" means that the variable resistance layer 104 included in the variable resistance element 101 is in the high resistance state. Note also that when the variable resistance element 101 included in the nonvolatile memory element 100 is in the high resistance state, the present description may only describe that "the nonvolatile memory element 100 is in the high resistance state". This manner of wording is similarly used for the case of a low resistance state as well.

The variable resistance layer 104 in the present embodiment has a stacked structure including: a first oxide layer 104a comprising a first metal oxide; and the second oxide layer 104b comprising a second metal oxide having an oxygen deficiency level lower than an oxygen deficiency level of the first metal oxide. The first oxide layer 104a is arranged between the first electrode 103 and the second oxide layer 104b. The second oxide layer 104b is arranged between the first oxide layer 104a and the second electrode 106.

It should be noted that the thickness of the second oxide layer 104b may be thicker or thinner than the thickness of the first oxide layer 104a. In this case, a structure where a local region 105 described later is not in contact with the first electrode 103 can be easily formed. Moreover, as mentioned above, the oxygen deficiency level of the second metal oxide included in the second oxide layer 104b is lower than the oxygen deficiency level of the first metal oxide included in the first oxide layer 104a. Thus, the resistance value of the second oxide layer 104b is higher than the resistance value of the first oxide layer 104a. On account of this, an electric field applied to the variable resistance layer 104 can be concentrated on the second oxide layer 104b.

The present embodiment describes, as an example, the case where a first metal included in the first metal oxide and a second metal included in the second metal oxide are of the same kind and comprise tantalum (Ta) that is a transition metal. Here, suppose that an oxygen-deficient tantalum oxide included in the first oxide layer 104a is represented by $TaO_x$, and that a tantalum oxide included in the second oxide layer 104b is represented by $TaO_y$. In this case, $0<x<2.5$ and $x<y$ may be satisfied. In order to stably implement a resistance change operation (that is, a normal operation such as a low-resistance write operation or a high-resistance write operation) with a voltage usually used by an electronic apparatus, $0.8 \leq x \leq 1.9$ and $2.1 \leq y$ may be satisfied. It should be noted that the compositions of the metal oxide layers (the first oxide layer 104a and the second oxide layer 104b) can be measured according to the Rutherford backscattering spectrometry.

The variable resistance layer 104 in the present embodiment further includes the local region 105 formed by an initial breakdown operation. To be more specific, the local region 105 can be formed by the initial breakdown operation performed on the variable resistance layer 104 having the stacked structure including the first oxide layer 104a and the second oxide layer 104b. It should be noted that the initial breakdown operation refers to an operation of applying, after manufacture, an initial breakdown voltage to a layer having a stacked structure including variable resistance materials (metal oxide layers) having different oxygen deficiency levels, in order to cause the layer to function as a variable resistance layer changing between a high resistance state and a low resistance state. To be more specific, the variable resistance layer 104 immediately after manufacture is in a high resistance state higher than a normal high resistance state. Therefore, the application of the initial breakdown voltage with a predetermined amplitude (which is usually larger than the amplitude of a voltage pulse applied in a normal operation) allows the variable resistance layer 104 to change from the high resistance state immediately after manufacture (the initial state) to a resistance state (a high resistance state or a low resistance state) where resistance is lower and a resistance change is possible. With the initial breakdown operation, the local region 105 is formed.

The local region 105 is formed in an area located in the first oxide layer 104a and the second oxide layer 104b. The area is in contact with the second electrode 106 and not in contact with the first electrode 103. To be more specific, the local region 105 is formed in the area that is in contact with the second electrode 106, that passes through the second oxide layer 104b, and that partly enters the first oxide layer 104a not to be in contact with the first electrode 103. The oxygen deficiency level of the local region 105 is higher than the oxygen deficiency level of the second oxide layer 104b.

In the present description, the local region 105 refers to a region through which a current predominantly flows in the variable resistance layer 104 when a voltage is applied between the first electrode 103 and the second electrode 106. More specifically, at least one conductive path (filament) is formed in the local region 105. The resistance change phenomenon is assumed to occur in the local region 105.

The local region 105 includes: a first local region 105a formed in the first oxide layer 104a; and a second local region 105b formed in an area that is located between the first local region 105a and the second electrode 106 and that is in contact with the first local region 105a and the second electrode 106. Typically, a metal oxide included in the first local region 105a and the metal oxide included in the first oxide layer 104a are the same kind of metal oxide. Moreover, a metal oxide included in the second local region 105b and the metal oxide included in the second oxide layer 104b are the same kind of metal oxide. The oxygen deficiency level of the first local region 105a is higher than the oxygen deficiency level of the first oxide layer 104a. Moreover, the oxygen deficiency level of the second local region 105b is lower than the oxygen deficiency level of the first local region 105a and higher than the oxygen deficiency level of the second oxide layer 104b.

Furthermore, the second local region 105b is a region where a filament is efficiently formed, and the first local region 105a is a region where oxygen movement in the second local region 105b is assisted in order for a resistance change to be assisted. Therefore, the resistance change in the variable resistance layer 104 occurs mainly in the second local region 105b. When a drive voltage is applied to the variable resistance layer 104 that is in the low resistance state, the current predominantly flows through the second local region 105b including the filament and through the first local region 105a where the resistance value is relatively low.

The present embodiment describes, as an example, the case where the variable resistance element 101 includes the first electrode 103, the second electrode 106, and the variable resistance layer 104 positioned between the first electrode 103 and the second electrode 106. However, a different layer may be arranged between the first electrode 103 and the second electrode 106. Moreover, in the configuration shown in FIG. 2, the first electrode 103 may be arranged on the substrate side or the second electrode 106 may be arranged on the substrate side.

[1-1-2. Relationship Between Local Region 105 and Number of Voltage Applications]

The local region 105 included in the variable resistance element 101 described above can be verified by the electron beam absorbed current (EBAC) analysis.

FIG. 3A to FIG. 3D shows images obtained by the EBAC analysis performed on the local region 105 in the respective cases where the initial breakdown voltage applied to the variable resistance element 101 is set to −3.3 V, −4.0 V, −7.0 V, and −10.0 V. It should be noted that, in the following description, the polarity of the voltage is defined by the potential of the second electrode 106 with respect to the potential of the first electrode 103. To be more specific, when the potential of the second electrode 106 is negative with respect to the potential of the first electrode 103, this polarity is defined as the negative polarity (that corresponds to a first polarity in the present embodiment). Moreover, when the potential of the second electrode 106 is positive with respect to the potential of the first electrode 103, this polarity is defined as the positive polarity (that corresponds to a second polarity in the present embodiment).

In each of FIG. 3A to FIG. 3D, the pulse width of the initial breakdown voltage is 100 nanoseconds (ns). It should be noted here that the measurement was performed using Hitachi Nanoprober N-6000 which is an EBAC characterization system manufactured by Hitachi High-Technologies Corporation, and that the analysis is carried out with 8 kilovolts (kV) as the accelerating voltage of the electron beam. In each of the EBAC-analyzed images shown in FIG. 3A to FIG. 3D, the local region 105 (the circled part in each of the EBAC-analyzed images in FIG. 3A to FIG. 3D) that is a spot-like area looking white (i.e., the resistance is low in this spot) can be seen.

Figure 4:
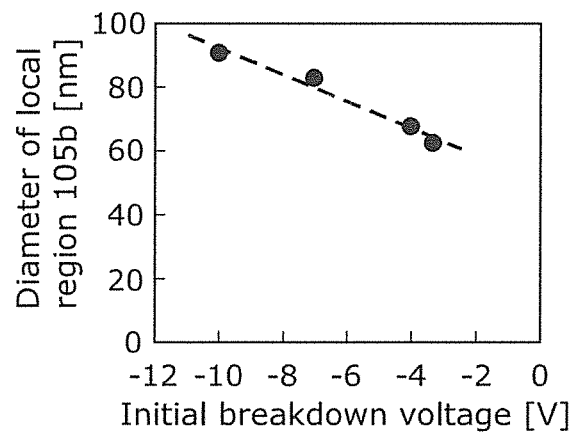
[FIG. 4]

FIG. 4 is a graph showing a result of obtaining the diameter of the local region 105 by performing image analysis on the EBAC-analyzed image. As can be seen from the graph shown in FIG. 4, when the absolute value of the initial breakdown voltage is larger, the area of the local region 105 is larger.

Considering that a normal write voltage (absolute value) is approximately 2.0 V, the graph in FIG. 4 indicates that even when a first write voltage is applied to the nonvolatile memory element 100 in a normal operation, that is, even when a low-resistance write voltage is applied to the variable resistance element 101, the area of the local region 105 is expected to become larger as well. To be more specific, as the low-resistance write voltage is repeatedly applied to the variable resistance element 101 in the normal operation and the voltage stress or current stress is accumulated, the local region 105 is assumed to become enlarged gradually. When the repeat count reaches a predetermined number of times, concerns are rising that the enlargement of the local region 105 may have an influence on the variable resistance characteristics.

[1-1-3. Characteristics of Variable Resistance Element 101]

Before the method of driving the nonvolatile memory element 100 according to the present embodiment is described, the characteristics of the variable resistance element 101 included in the nonvolatile memory element 100 having the configuration described above are firstly explained as an example.

It should be noted that when the aforementioned variable resistance element 101 is driven (when the normal operation is performed), a voltage satisfying a predetermined condition is applied between the first electrode 103 and the second electrode 106 from an external power supply via the current steering element 102. To be more specific, when the external power supply applies the voltage to the nonvolatile memory element 100, the voltage satisfying the predetermined condition can be applied to the variable resistance element 101 included in the nonvolatile memory element 100. Then, according to the value and polarity of the voltage applied to the variable resistance layer 104, the resistance value of the variable resistance layer 104 of the variable resistance element 101 reversibly increases or decreases.

For example, when the variable resistance element 101 is to be set to the low resistance state, the low-resistance write voltage is applied to the variable resistance element 101 by applying the first write voltage to the nonvolatile memory element 100. The low-resistance write voltage refers to a negative-polarity pulse voltage that is larger in amplitude than a predetermined threshold voltage of the variable resistance element 101. When the low-resistance write voltage is applied to the variable resistance element 101, the resistance value of the variable resistance layer 104 decreases and the variable resistance layer 104 thus enters the low resistance state.

On the other hand, when the variable resistance element 101 is to be set to the high resistance state, a high-resistance write voltage is applied to the variable resistance element 101 by applying a second write voltage to the nonvolatile memory element 100. The high-resistance write voltage refers to a positive-polarity pulse voltage that is larger in amplitude than the predetermined threshold voltage of the variable resistance element 101. When the high-resistance write voltage is applied to the variable resistance element 101, the resistance value of the variable resistance layer 104 increases and the variable resistance layer 104 thus enters the high resistance state.

Here, when the resistance state of the variable resistance element 101 is to be read, a read voltage is applied to the variable resistance element 101 by applying a read voltage to the nonvolatile memory element 100. The read voltage applied to the variable resistance element 101 refers to a pulse voltage that is smaller in amplitude than the threshold voltage of the variable resistance element 101, and does not cause the resistance value of the variable resistance layer 104 to change.

Moreover, note that data described in the following is based on the case where the variable resistance element 101 is formed by setting each of the first electrode 103, the second electrode 106, and the variable resistance layer 104 to be 0.5 μm*0.5 μm in size (0.25 μm² in area). The first electrode 103 is formed using tantalum nitride. The second electrode 106 is formed using iridium. The first oxide layer 104a is formed using oxygen-deficient tantalum oxide $TaO_x$ (where x=1.09). The second oxide layer 104b is formed using tantalum oxide $TaO_y$ (where y=2.47). Furthermore, the variable resistance layer 104, the first oxide layer 104a, the second oxide layer 104b are 38 nm, 34 nm, and 4 nm in thickness, respectively. Moreover, as the transistor 102a included in the current steering element 102, an N-channel metal oxide semiconductor (NMOS) transistor which is 0.44 μm in the gate width, 0.18 μm in the gate length, and 3.5 nm in the thickness of a gate insulating film (Tox) is used.

[1-1-4. Characteristics of Nonvolatile Memory Element: Endurance Characteristics]

Figure 5:
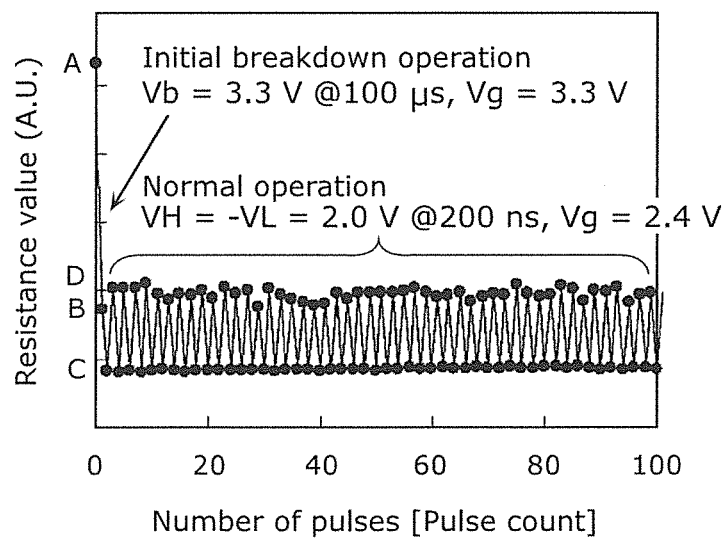
[FIG. 5]
Figure 6:
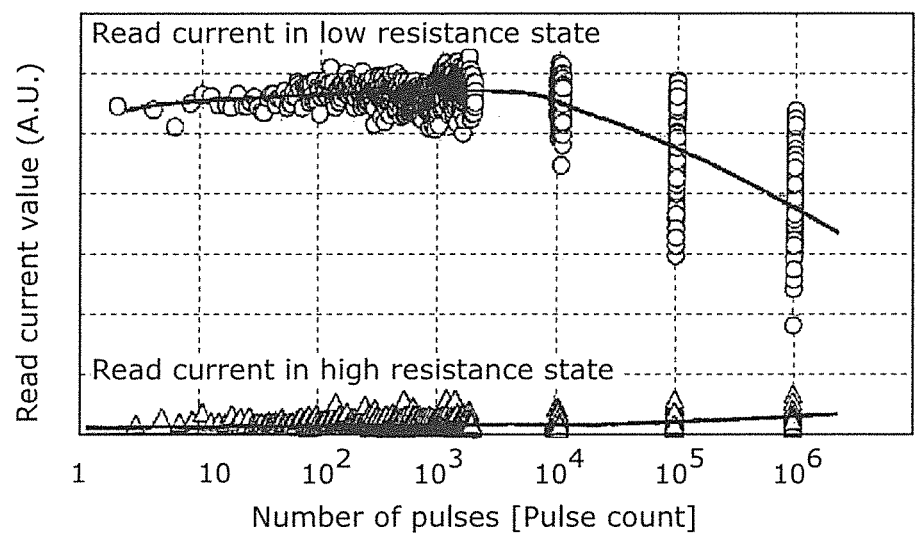
[FIG. 6]

The endurance characteristics of the nonvolatile memory element 100 are described, with reference to FIG. 5 and FIG. 6.

Firstly, driving conditions of the initial breakdown operation and the normal operation in the case where the resistance of the transistor 102a is not to be changed are described with reference to FIG. 5.

FIG. 5 shows an example of a relationship between the resistance value and the number of voltage applications in the case where the initial breakdown operation is performed on the nonvolatile memory element 100 immediately after manufacture and then the normal operation (the low-resistance write operation or the high-resistance write operation) is repeatedly performed.

In FIG. 5, a point A denotes the resistance value in the initial state after manufacture. A point B denotes the resistance value of when the local region 105 is formed by the initial breakdown operation. A point C denotes the resistance value of when the variable resistance element 101 is set to the low resistance state by the low-resistance write operation performed as the normal operation. A point D denotes the resistance value of when the variable resistance element 101 is set to the high resistance state by the high-resistance write operation performed as the normal operation.

The initial breakdown operation is performed under a driving condition where: a gate voltage "Vg" of the transistor 102a is set to 3.3 V; an initial breakdown voltage "Vb" to be applied to the nonvolatile memory element 100 is set to 3.3 V; and the pulse width is set to 100 μs. As a result, the resistance value of the nonvolatile memory element 100 is significantly reduced from the point A to the point B, as shown in FIG. 5. This is assumed to result from the fact that the local region 105 is formed in the variable resistance element 101 included in the nonvolatile memory element 100.

Moreover, the normal operation is performed under a driving condition where: the gate voltage Vg of the transistor 102a is set to 2.4 V; a first write voltage "-VL" is set to -2.0 V; the pulse width of the first write voltage -VL is set to 200 ns; a second write voltage "VH" is set to 2.0 V; and the pulse width of the second write voltage VH is set to 200 ns. As a result of repeated applications of the first write voltage -VL and the second write voltage VH under this driving condition, the resistance change can be stably repeated between the low resistance state (the point C) and the high resistance state (the point D) as shown in FIG. 5.

FIG. 6 is a graph showing an example of a relationship between the read current and the number of pulses applied to the nonvolatile memory element 100, for each of the low resistance state and the high resistance state. The number of pulses is a sum of the numbers of voltage applications including the initial breakdown voltage, the first write voltage -VL, and the second write voltage VH. In FIG. 6, the first application is performed with the initial breakdown voltage. Moreover, FIG. 6 shows the read currents of the case where the first write voltage -VL and the second write voltage VH are applied up to $10^3$ times, and also shows 100 read currents for each of points corresponding to the $10^3$th, $10^4$th, $10^5$th, and $10^6$th applications. Note that the vertical axis represents the read current in order for the degradation behavior in the low resistance state to be easily understood.

As can be seen from FIG. 6, the values of the read current in the low resistance state, while having slight variations, are stable up to the point where the number of voltage applications is approximately $10^3$. However, after the number of voltage applications reaches approximately $10^4$, the variations are greater and, in addition, the value of the read current is reduced in some cases. As the number of voltage applications further increases to reach $10^5$ times and $10^6$ times, the variations increase and the value of the read voltage is reduced overall. To be more specific, when the number of executions of the normal operation performed on the nonvolatile memory element 100 reaches $10^4$ and more, a difference between the read current in the low resistance state and the read current in the high resistance state is reduced. As a result, a problem of a reduced read margin arises.

[1-1-5. Characteristics of Nonvolatile Memory Element 100: Current-Voltage (I-V) Characteristics]

Figure 7:
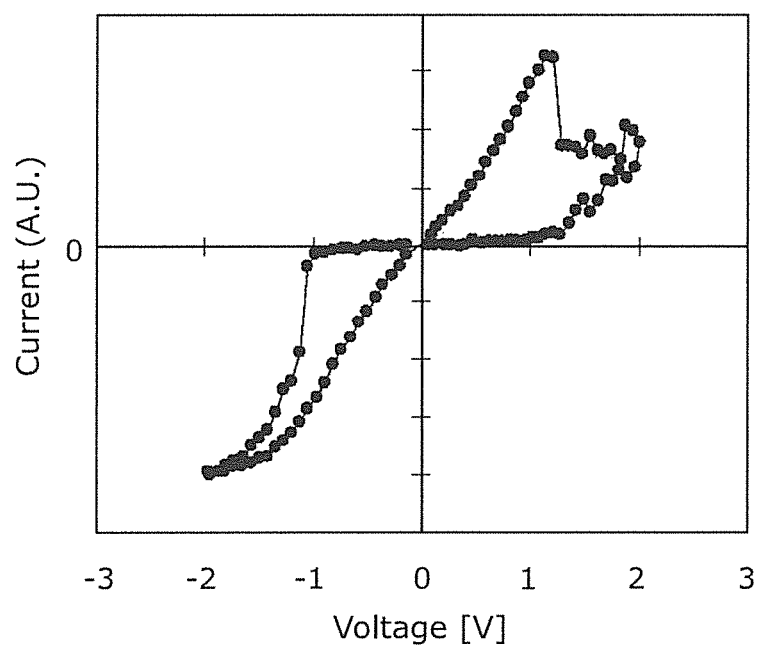
[FIG. 7]

FIG. 7 is a graph showing an example of the I-V characteristics of the nonvolatile memory element 100 when the normal operation is performed.

The graph shown in FIG. 7 plots the values of the current passing through the nonvolatile memory element 100 when the first write voltage -VL, while sequentially reduced from -0.1 V to -2.0 V in decrements of about 0.07 V, is applied to the nonvolatile memory element 100 in the high resistance state. Moreover, the graph shown in FIG. 7 plots the values of the current passing through the nonvolatile memory element 100 when the second write voltage VH, while sequentially increased from 0.1 V to 2.0 V in increments of about 0.07 V, is applied to the nonvolatile memory element 100 in the low resistance state. It should be noted that each pulse width of the first write voltage -VL and the second write voltage VH is set to 200 ns and that the gate voltage Vg of the transistor 102a is set to 2.4 V.

Figure 8:
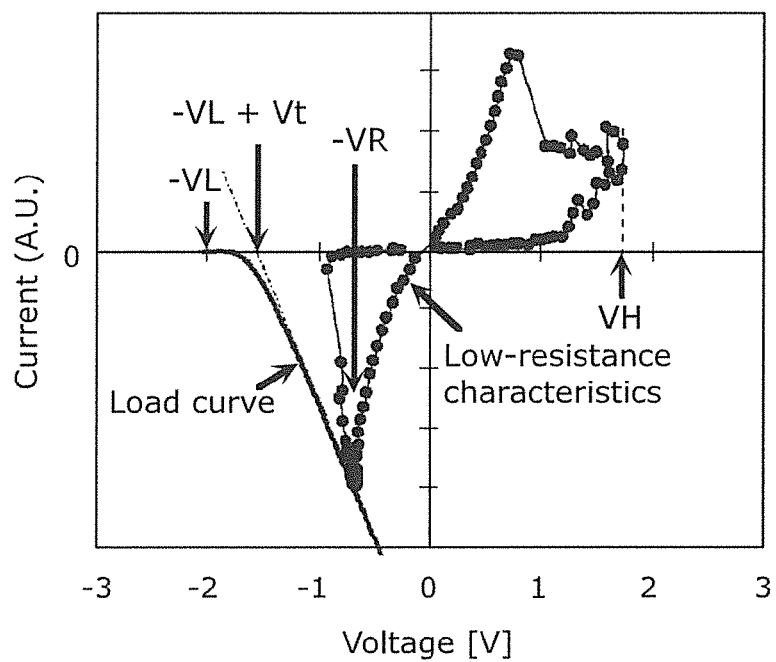
[FIG. 8]

FIG. 8 is a graph showing an example of the I-V characteristics of the variable resistance element 101 alone when the normal operation is performed, and also showing the characteristics of the transistor 102a at the end of the low-resistance write operation. The graph shown in FIG. 8 is obtained by: calculating a value of a voltage (a low-resistance voltage or a high-resistance voltage) applied to the variable resistance element 101 alone by subtracting the value of the voltage applied to the transistor 102a from the applied voltage (the first write voltage -VL or the second write voltage VH) for each point shown in FIG. 7; and then re-plotting the current values corresponding to these calculated voltage values. The value of the voltage applied to the transistor 102a is calculated by executing Simulation Program with Integrated Circuit Emphasis (SPICE) using the value of the applied voltage (the first write voltage or the second write voltage) at the corresponding point shown in FIG. 7 and the value of the current passing through the nonvolatile memory element 100.

[1-1-6. Characteristics of Variable Resistance Element 101: Base Resistance Rb and I-V Characteristics of Local Region 105]

Next, the following describes a base resistance Rb and the I-V characteristics of the second local region 105b formed in the variable resistance layer 104 included in the variable resistance element 101.

Figure 9:
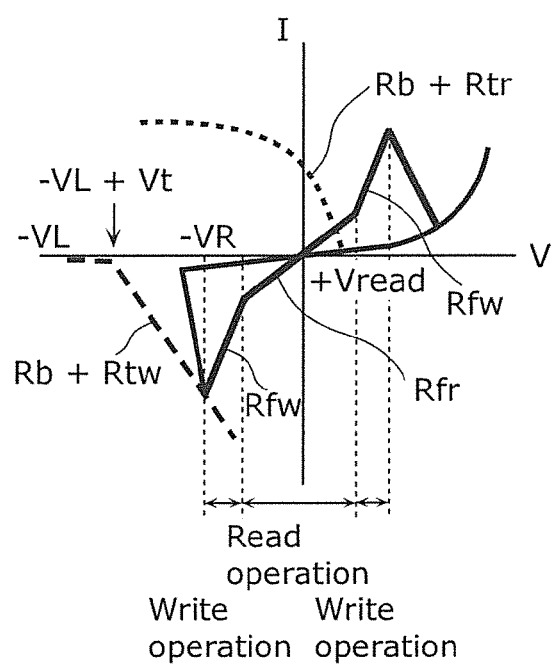
[FIG. 9]

FIG. 9 is a graph simplifying the I-V characteristics of the second local region 105b formed in the variable resistance layer 104.

The horizontal axis "V" shown in FIG. 9 represents the voltage applied to the second local region 105b, and the vertical axis "I" represents the current passing through the second local region 105b. In the graph of FIG. 9, a load curve (Rb+Rtw) obtained at the end of the low-resistance write operation is indicated by the dashed line, and a load curve (Rb+Rtr) obtained in the read operation is indicated by the dotted line. Note that, in FIG. 9, "Rtw" represents the resistance value of the transistor 102a in the write operation and that "Rtr" represents the resistance value of the transistor 102a in the read operation.

As the resistance value of the variable resistance element 101, a resistance value "Rf" of the second local region 105b is assumed to be mainly predominant. On this account, with reference to the graph shown in FIG. 8, the I-V characteristics of the second local region 105b can be represented by the simplified graph shown in FIG. 9. The I-V characteristics of the variable resistance element 101 in the low resistance state have the non-linearity as shown in FIG. 8. Thus, in the graph shown in FIG. 9, the I-V characteristics of the variable resistance element 101 are divided into an area for the read operation and an area for the write operation. Then, the areas are approximated to respective line graphs having a resistance value Rtr for the read operation and a resistance value Rfw for the write operation.

[1-1-7. Method of Calculating Base Resistance Rb]

Here, the load applied to the second local region 105b includes a resistance component other than the resistance components of the transistor 102a and the second local region 105b of the variable resistance element 101. The resistance component of the variable resistance element 101 other than the second local region 105 is represented by a resistance value that is a sum of mainly the resistance values of the first local region 105a and the first oxide layer 104a, and is referred to as the base resistance Rb hereafter.

From FIG. 9, a resistance value "Rfr" of the second local region 105b in the read operation is expressed by Equation 1 below using a constant α.

$$Rfr = \alpha * Rfw \qquad \text{Equation 1}$$

When the value of the base resistance Rb is assumed to be small enough, the value of α can be obtained by approximating the resistance characteristics of the graph shown in FIG. 8 to the three line graphs as shown in FIG. 9. The value of α calculated from the actual measured values of the aforementioned variable resistance element 101 is about 1.7.

In the case of the I-V characteristics of the second local region 105b shown in FIG. 9, when the variable resistance element 101 changes from the high resistance state to the low resistance state and the voltage applied to the variable resistance element 101 exceeds the threshold voltage, oxygen moves from the second local region 105b to the first local region 105a. As a result, the resistance of the second local region 105b is reduced due to an increase in the oxygen defect density. When the applied voltage is further increased, the oxygen defect density of the second local region 105b accordingly increased and, as a result, the resistance is further reduced. Therefore, the absolute value of the voltage applied to the second local region 105b at the end of the low-resistance write operation is smaller than the absolute value of the voltage applied to the second local region 105b when the applied voltage is equal to the threshold voltage.

Here, the absolute value of the voltage applied to the second local region 105 at the end of the low-resistance write operation is defined as "VR". When the value of the base resistance Rb is assumed to be small enough, VR can be defined as the voltage applied to the variable resistance element 101 at the end of the low-resistance write operation as in FIG. 8. It should be noted that the value of VR may be derived using the fitting method by assuming an equation for the low-resistance characteristics from the conduction mechanism (such as hopping conduction or tunneling conduction) of the second local region 105b.

When the variable resistance element 101 is in the low resistance state, a resistance value "RL" of the nonvolatile memory element 100 overall in the read operation is expressed by Equation 2 below using the base resistance Rb, the resistance value Rfr of the second local region 105b in the read operation, and the resistance value Rtr of the transistor 102a in the read operation.

$$RL = Rfr + Rb + Rtr \qquad \text{Equation 2}$$

Moreover, the resistance value Rtw of the second local region 105b in the high-resistance write operation is expressed by Equation 3 below using the resistance value Rtw of the transistor 102 in the high-resistance write operation.

$$Rfw = VR/(VL - Vt - VR) * (Rb + Rtw) \qquad \text{Equation 3}$$

Note that the base resistance Rb is assumed to be a linear resistance. Here, "VL" represents the absolute value of the first write voltage. Moreover, "Vt" represents the absolute value of a dummy threshold voltage of the transistor 102a in the case where a source follower is connected as shown in FIG. 8, and changes according to the first write voltage −VL and the gate voltage Vg.

Accordingly, the base resistance Rb is expressed by Equation 4 below.

$$Rb = (RL - \alpha\beta Rtw - Rtr)/(1 + \alpha\beta) \qquad \text{Equation 4}$$

Here, note that the coefficient β and the resistance value Rfr of the transistor 102a in the read operation is expressed by Equation 5 and Equation 6 below, respectively.

$$\beta = VR/(VL - Vt - VR) \qquad \text{Equation 5}$$

$$Rfr = \alpha\beta(RL + Rtw - Rtr)/(1 + \alpha\beta) \qquad \text{Equation 6}$$

The resistance value Rtr of the transistor 102a in the read operation and the resistance value Rtw of the transistor 102a in the write operation are constants as well. Therefore, the value of the base resistance Rb can be calculated from the value of the resistance value RL of the nonvolatile memory element 100 overall in the read operation.

[1-1-8. Increase in Base Resistance Rb Due to Increase in Repeat Count]

Next, the following describes the base resistance Rb in the cases where the read current does not decrease and where the read current decreases, when the first application is performed with the initial breakdown voltage and, after this, the first write voltage −VL and the second write voltage VH are alternately applied.

Here, the resistance change operations (the low-resistance write operation and the high-resistance write operation) are performed to compare the results. As is the case shown in FIG. 6, the driving condition is as follows: the gate voltage Vg of the transistor 102a is set to 2.4 V; the first write voltage −VL is set to −2.0 V; the pulse width of the first write voltage −VL is set to 200 ns; the second write voltage VH is set to +2.0 V; and the pulse width of the second write voltage VH is set to 200 ns.

Figure 10A:
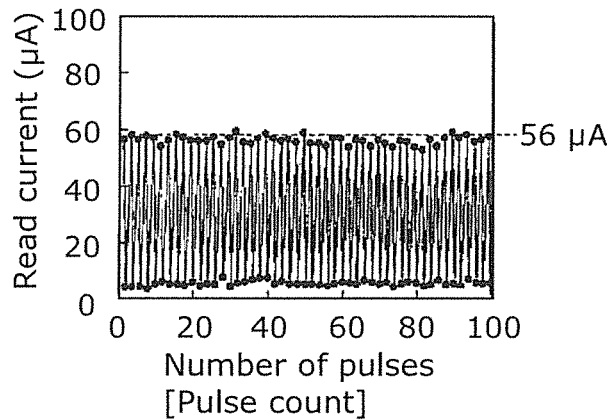
[FIG. 10A]
Figure 10B:
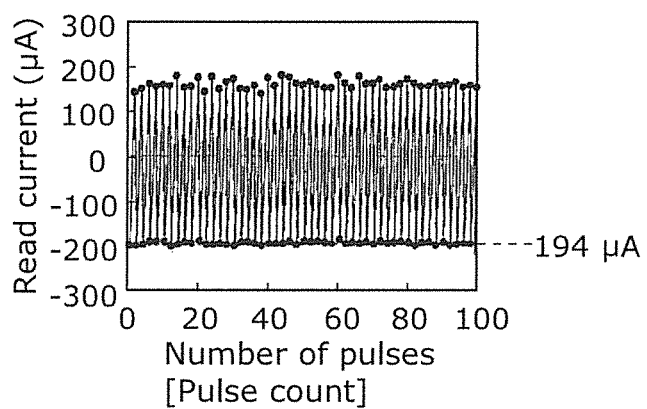
[FIG. 10B]
Figure 10C:
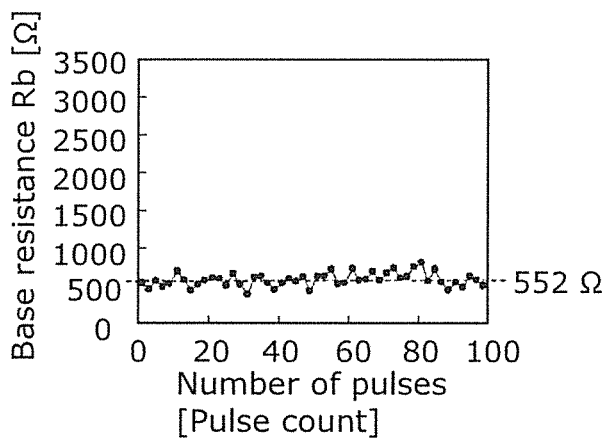
[FIG. 10C]

FIG. 10A and FIG. 10B are graphs showing the read current value and the write current value, respectively, when the number of applications (the pulse count) of the voltages including the initial breakdown voltage is from 1 to 100 in the case where the first write voltage −VL and the second write voltage VH are alternately applied immediately after the initial breakdown operation under the aforementioned driving condition. Moreover, FIG. 10C is a graph showing a result of calculating the base resistance Rb in each low resistance state when the aforementioned driving condition, that is: Vg=2.4 V; VL=2.0 V; VR=0.6 V; Vt=0.4 V; α=1.7; Rtr=1.5 kΩ; and Rtw=4.5 kΩ, is employed in Equation 4 and Equation 5 in FIG. 10A and FIG. 10B.

As shown in the graph of FIG. 10A, the median value of the read current in the initial 100 resistance-change operations in the low resistance state is about 56 μA. Moreover, the median value of the write current to change to the low resistance state is about −194 μA, and the median value of the base resistance Rb is 522Ω.

Figure 11A:
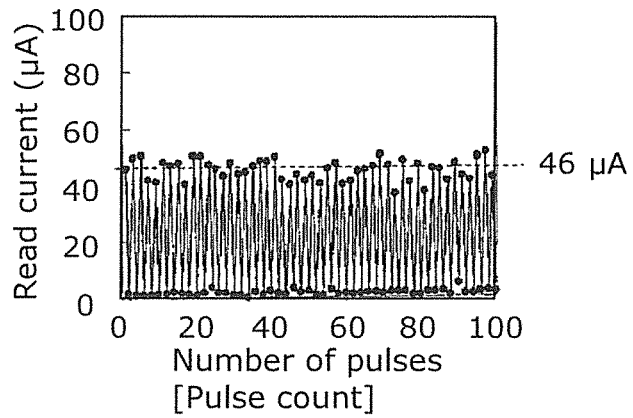
[FIG. 11A]
Figure 11B:
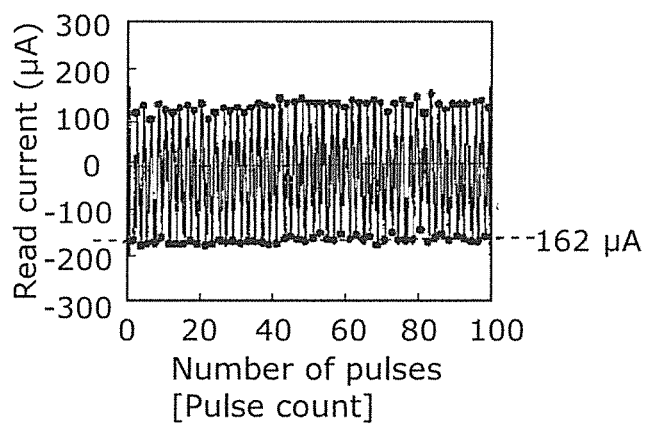
[FIG. 11B]
Figure 11C:
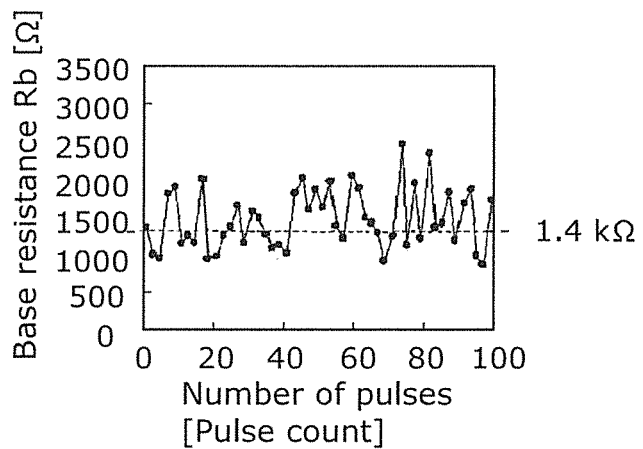
[FIG. 11C]

FIG. 11A and FIG. 11B are graphs showing the read current value and the write current value, respectively, when the number of applications (the pulse count) of the voltages including the initial breakdown voltage is $10^5$ to $10^5+100$. Moreover, FIG. 11C is a graph showing a result of calculating the base resistance Rb in each low resistance state when the aforementioned driving condition is employed in Equation 4 and Equation 5 in FIG. 11A and FIG. 11B.

As shown in the graph of FIG. 11A, the median value of the read current in the $10^5$ to $10^5+100$ resistance-change operations in the low resistance state is about 46 μA. Moreover, the median value of the write current to change to the low resistance state is about −164 μA, and the median value of the base resistance Rb is about 1.4 kΩ.

As can be understood from FIG. 10A and FIG. 11A, the absolute values of the read current and the write current are reduced from the $10^5$th operation and the value of the base resistance Rb increases by about 900Ω, as compared with the case where the resistance change operation is performed up to 100 times.

This is assumed to result from the fact that the second local region 105b increases in size because of the accumulation of the voltage stress or current stress due to the increase in the number of the voltage applications in the resistance change operations, and that the amount of oxygen in the first local region 105a accordingly increases thereby to increase the first local region 105a in resistance.

[1-2. Method of Changing Resistance Value of Transistor 102a]

On the basis of the characteristics of the variable resistance element 101 described above, the method of changing the resistance value of the transistor 102a is described with reference to examples shown in FIG. 12A to FIG. 13.

As described above, as the number of voltage applications in the resistance change operations increases, the base resistance Rb of the variable resistance element 101 is likely to increase and the value of the read current in the low resistance state is likely to decrease.

Thus, when the amount of low-resistance write current passing through the variable resistance element 101 (the local region 105) is outside a predetermined range, the stable endurance characteristics can be obtained by changing the resistance value of the transistor 102a in the low-resistance write operation (corresponding to the changing of a resistance value of the transistor). In the present embodiment, the resistance value of the transistor 102a is changed to cause the amount of low-resistance write current passing through the variable resistance element 101 to approach the predetermined range.

The method of changing the resistance value of the transistor 102a is described in detail as follows, with reference to FIG. 7 to FIG. 13. It should be noted that although the present embodiment describes the case where the resistance value of the transistor 102a is changed by changing the gate voltage of the transistor 102a, this is not intended to be limiting. For example, the value of the voltage applied to the nonvolatile memory element 100 overall may be changed. Instead of changing the gate voltage, the value of the voltage applied to the nonvolatile memory element 100 overall may be changed, for instance.

Figure 12A:
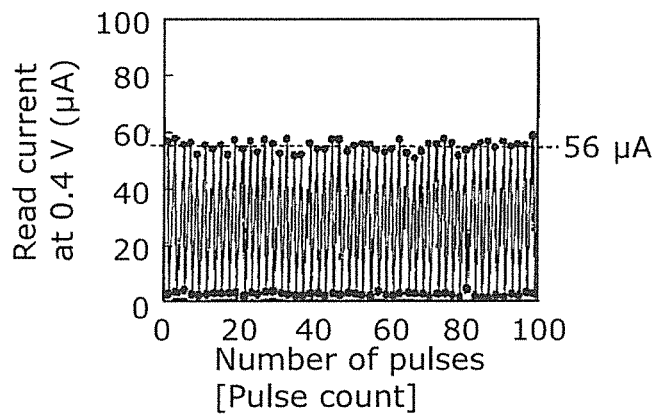
[FIG. 12A]
Figure 12B:
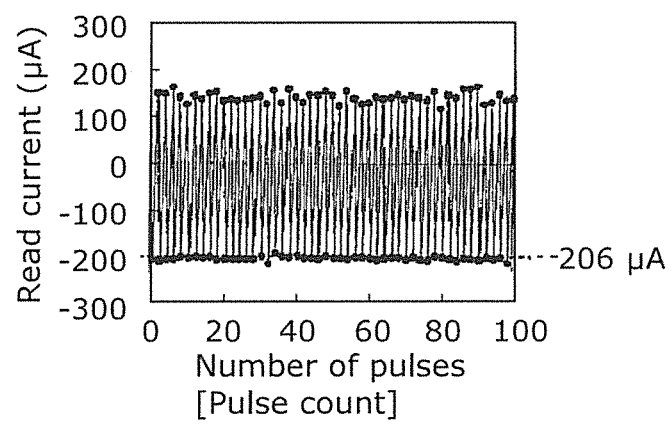
[FIG. 12B]

FIG. 12A and FIG. 12B are graphs showing the read current value and the write current value, respectively, in the case where: the resistance change operation is performed up to $10^5$ times under the same driving condition as in the case shown in FIG. 10A to FIG. 10C; and the driving condition is changed when the aforementioned base resistance Rb increases to about 1.4 kΩ and then the resistance change operation is performed 100 times. As the driving condition used up to the $10^5$th operation, the gate voltage Vg of the transistor 102a is set to 2.4 V; the first write voltage −VL is set to −2.0 V; the pulse width of the first write voltage −VL is set to 200 ns; the second write voltage VH is set to +2.0 V; and the pulse width of the second write voltage VH is set to 200 ns. As the driving condition used after the $10^5$th operation, only the gate voltage Vg of the transistor 102a is increased from 2.4 V to 2.6 V.

Figure 12C:
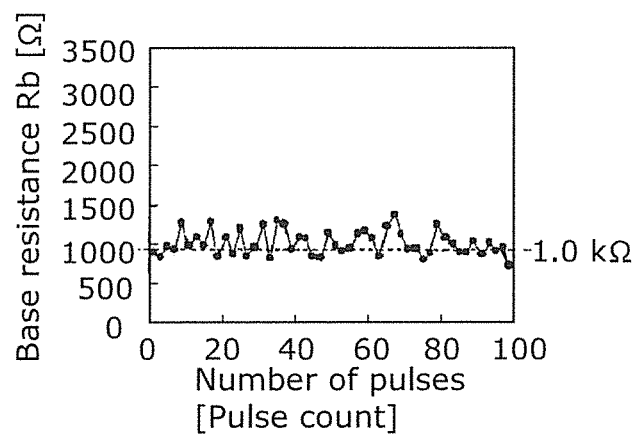
[FIG. 12C]

FIG. 12C is a graph showing a result of calculating the value of the base resistance Rb in each low resistance state when the changed driving condition is employed in Equation 4 and Equation 5 in FIG. 12A and FIG. 12B. Here, the absolute value VL of the first write voltage is set to 2.0 V without any change, and only the gate voltage Vg is increased by 0.2 V. As a result of this, the value of the threshold voltage Vt of the transistor 102a is reduced by about 0.2 V. On account of this, the base resistance Rb is calculated based on: Vg=2.6 V; VL=2.0 V; VR=0.6 V; Vt=0.2 V; α=1.7; Rtr=1.5 kΩ; and Rtw=4.5 kΩ.

As can be seen from the graphs shown in FIG. 12A to FIG. 12C, when the gate voltage Vg of the transistor 102 is increased to 2.6 V after $10^5$ operations, the median value of the read current in the low resistance state is about 56 μA. Moreover, the median value of the write current to change to the low resistance state is about −206 μA, and the median value of the base resistance Rb is 1.0 kΩ. The absolute values of the read current and the write current return to approximately the initial states (about 56 μA as the median value of the read current and about −194 μA as the absolute value of the write current). Furthermore, as compared with the case where the gate voltage Vg is not increased (about 1.4 kΩ), the value of the base resistance Rb is reduced by about 400Ω.

Figure 13:
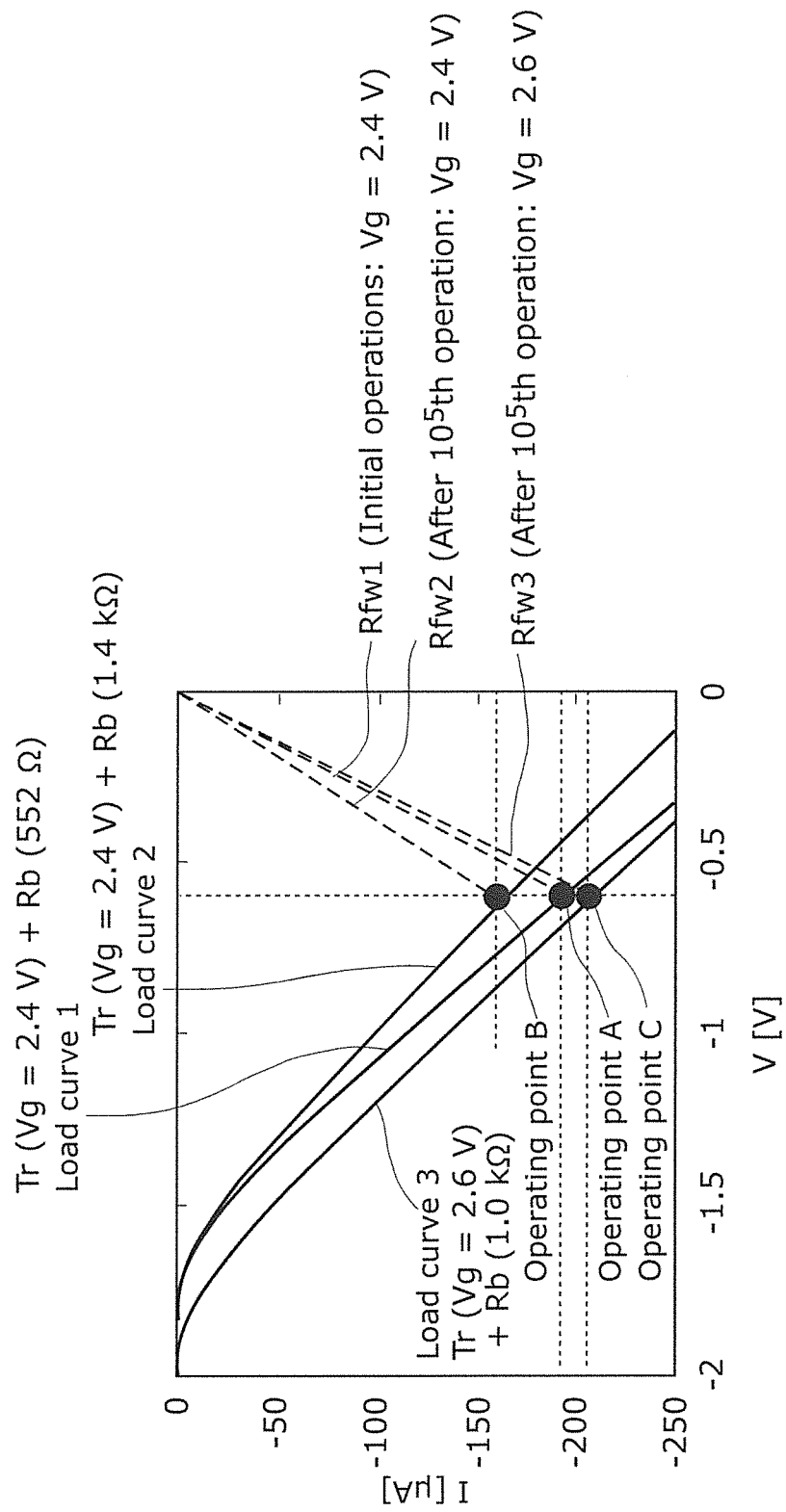
[FIG. 13]

FIG. 13 is a graph showing a result of examining operating points of the second local region 105b for each variable resistance characteristic shown by the graphs in FIG. 10A to FIG. 12C. The horizontal axis represents the voltage applied to the local region 105b, and the vertical axis represents the value of the current passing in the low-resistance write operation. In FIG. 13, operating points A to C of the second local region 105b are calculated using Equation 1 to Equation 6. To be more specific, the operating point A of the second local region 105b in the low-resistance write operation in the case where the gate voltage Vg is 2.4 V and the base resistance Rb is 552Ω as shown in the graphs of FIG. 10A to FIG. 10C is calculated. Moreover, the operating point B of the second local region 105b in the low-resistance write operation in the case where the gate voltage Vg is 2.4 V and the base resistance Rb is 1.4 kΩ as shown in the graphs of FIG. 11A to FIG. 11C is calculated. Furthermore, the operating point C of the second local region 105b in the low-resistance write operation in the case where the gate voltage Vg is 2.6 V and the base resistance Rb is 1.0 kΩ as shown in the graphs of FIG. 12A to FIG. 12C is calculated. The resistance value Rfw1 of the second local region 105b in the low-resistance write operation in the case where the gate voltage Vg is 2.4 V and the base resistance Rb is 552Ω as shown in the graphs of FIG. 10A to FIG. 10C has the slope of the dashed line connecting the operating point A to the origin point. The resistance value Rfw2 of the second local region 105b in the low-resistance write operation in the case where the gate voltage Vg is 2.4 V and the base resistance Rb is 1.4 kΩ as shown in the graphs of FIG. 11A to FIG. 11C has the slope of the dashed line connecting the operating point B to the origin point. The resistance value Rfw3 of the second local region 105b in the low-resistance write operation in the case where the gate voltage Vg is 2.6 V and the base resistance Rb is 1.0 kΩ as shown in the graphs of FIG. 12A to FIG. 12C has the slope of the dashed line connecting the operating point C to the origin point. In FIG. 13, the load curve 1 is obtained when the gate voltage Vg is 2.4 V and the base resistance Rb is 552Ω as shown in FIG. 10A to FIG. 10C. The load curve 2 is obtained when the gate voltage Vg is 2.4 V and the base resistance Rb is 1.4 kΩ as shown in FIG. 11A to FIG. 11C. The load curve 3 is obtained when the gate voltage Vg is 2.6 V and the base resistance Rb is 1.0 kΩ as shown in FIG. 12A to FIG. 12C.

As can be seen from FIG. 13, when the resistance change operation is performed $10^5$ times without changing the driving condition used from the initial state, the operating point is changed from A to B because of the increases in the base resistance Rb and in the resistance value of the second local region 105b. Then, when the gate voltage Vg of the transistor 102a is increased by 0.2 V to 2.6 V and the resistance change operation is further performed 100 times, it can be seen that the operating point is changed from the operating point B relatively far from the operating point A to the operating point C relatively close to the operating point A. To be more specific, it can be understood that, by increasing the gate voltage Vg, the base resistance Rb and the resistance of the second local region 105b which have increased with the increase in the number of executions of the resistance change operation can be reduced.

The above describes the case where the resistance value increases with the repeated executions of the resistance change operation, with reference to FIG. 11A to FIG. 11C. This case is assumed to be based on the following mechanism for example. Firstly, the base resistance Rb is assumed to increase because the oxygen ions of the second local region 105b are expelled into the first local region 105a. As a result, the voltage distributed to the second local region 105b is reduced because of the increase in the resistance value of the base resistance Rb. Accordingly, it is assumed that the oxygen included in the second local region 105b is prevented from moving, and that the resistance value of the second local region 105b thus increases. In the examples shown in FIG. 11A to FIG. 11C and FIG. 13, under the driving condition that the gate voltage Vg is 2.4 V, the oxygen ions are accumulated in the first local region 105a and the base resistance Rb and the resistance value of the second local region 105a both increase.

To address this, the gate voltage Vg is increased as described above. As a result, since the oxygen ions accumulated in the first local region 105a are diffused toward the first oxide layer 104a, the base resistance Rb can be reduced. Accordingly, the voltage distributed to the second local region 105b increases, thereby reducing the resistance of the second local region 105b.

To be more specific, when the resistance value of the nonvolatile memory element 100 increases with the repeated executions of the resistance change operation, the resistance value of the nonvolatile memory element 100 can be stabilized by increasing the gate voltage Vg to decrease the resistance value of the nonvolatile memory element 100. In other words, even when the base resistance Rb and the resistance value of the second local region increase with the increase in the repeat count of the resistance change operation, the resistance value of the nonvolatile memory element 100 overall can be kept within a certain range by increasing the gate voltage Vg of the transistor 102a to decrease the resistance value of the transistor 102a. As a result, by keeping the low-resistance write current passing through the second local region 105b within a certain range to maintain the operating point, the approximately constant low-resistance state can be maintained. Moreover, the increased base resistance Rb and the increased resistance value of the second local region can be reduced.

On the other hand, the resistance value may decrease with the repeated executions of the resistance change operation. This is assumed to result from, for example, that the second local region 105b increases in area or in oxygen defect density because the oxygen ions of the second local region 105b are expelled into the first local region 105a and that the resistance value of the second local region 105b is thus reduced. When the resistance value of the nonvolatile memory element 100 is reduced, the resistance value of the nonvolatile memory element 100 overall can be kept within the certain range by decreasing the gate voltage Vg of the transistor 102a to increase the resistance value of the transistor 102a. As a result, by keeping the low-resistance write current passing through the second local region 105b within the certain range to maintain the operating point, the approximately constant low-resistance state can be maintained. Moreover, the reduced base resistance Rb and the reduced resistance value of the second local region can be increased. For instance, in the examples shown in FIG. 11A to FIG. 11C and FIG. 13, when the base resistance Rb and the resistance value of the second local region 105b are reduced too much from predetermined resistance values, the gate voltage Vg may be reduced from 2.6 V to 2.4 V to cause the operating point to be close to the operating point A shown in FIG. 13. In other words, by reducing the gate voltage Vg, that is, by changing the resistance value of the transistor 102a to cause the changed resistance value to approach a predetermined range, the amount of low-resistance write current passing through the variable resistance element 101 can be changed to approach the predetermined range (to cause the operating point to be close to the operating point A).

The following describes the method of calculating an amount of change $\Delta Vg$ in the gate voltage Vg of the transistor 102a, the amount of change $\Delta Vg$ causing the operating point to be constant (causing the operating point to approach a predetermined range) with respect to an amount of change $\Delta Rb$ in the resistance value of the base resistance Rb. It should be noted that the amount of change $\Delta Rb$ of the base resistance Rb and the amount of change $\Delta Vg$ in the gate voltage Vg of the transistor 102a are determined on a one-to-one basis.

A current I passing at the end of the low-resistance write operation is expressed by Equation 7 below.

$$I=(VL-Vt-VR)/(Rtw+Rb) \qquad \text{Equation 7}$$

From Equation 7, an amount of change $\Delta I$ in the current I when the base resistance Rb changes only by $\Delta Rb$ is expressed by Equation 8 below.

$$\Delta I=-(VL-Vt-VR)/(Rtw+Rb)^2 * \Delta Rb \qquad \text{Equation 8}$$

Moreover, the amount of change $\Delta I$ in the current I when the threshold voltage Vt of the transistor 102a changes infinitesimally only by $\Delta Vt$ is expressed by Equation 9 below.

$$\Delta I=-\Delta Vt/(Rtw+Rb) \qquad \text{Equation 9}$$

Here, when VL<Vg–Vt, $\Delta Vt=\Delta Vg$. Therefore, the amount of change $\Delta I$ in the current I can be expressed by Equation 10 below.

$$\Delta I=\Delta Vg/(Rtw+Rb) \qquad \text{Equation 10}$$

Thus, the amount of change $\Delta Vg$ in the gate voltage of the transistor 102a needed to compensate for the amount of change $\Delta Rb$ of the base resistance Rb can be expressed by Equation 11 below.

$$\Delta Vg=(VL-Vt-VR)/(Rtw+Rb)*\Delta Rb \qquad \text{Equation 11}$$

Here, as described above, when the driving condition in the graphs shown in FIG. 10A to FIG. 10C, that is: VL=2.0 V; VR=0.6 V; Vt=0.4 V; Rtw=4.5 k$\Omega$; and Rb=552$\Omega$, is substituted into Equation 11, the amount of change $\Delta Vg$ in the gate voltage Vg of the transistor 102a can be expressed by Equation 12 below.

$$\Delta Vg=\Delta Rb/5052 \qquad \text{Equation 12}$$

Hence, when the base resistance Rb changes by about 250$\Omega$ for example, the gate voltage Vg of the transistor 102a may be changed by about 0.05 V ($\Delta Vg=250/5052\approx0.05$). Alternatively, when the base resistance Rb is changed by about 500$\Omega$, the gate voltage Vg of the transistor 102a may be changed by about 0.1 V.

Moreover, from Equation 5, the amount of change ΔRb of the base resistance Rb is expressed by Equation 13 below.

$$\Delta Rb = \Delta RL/(1+\alpha\beta) \qquad \text{Equation 13}$$

Using Equation 13, the amount of change ΔVg in the gate voltage Vg of the transistor 102a can be expressed by Equation 1 below.

$$\Delta Vg = \Delta RL/10205 \qquad \text{Equation 14}$$

Therefore, it is understood that, when the initial value Rb (0) of the base resistance Rb is known in advance, the amount of change ΔRL in the resistance value RL read in the low resistance state can be calculated and thus the amount of change ΔVg in the gate voltage Vg of the transistor 102a can be calculated.

Accordingly, from Equation 12 or Equation 14, the gate voltage Vg can be calculated from the amount of change ΔRb (m) of the base resistance Rb (where m represents the repeat count of the resistance change operation, i.e., the number of pulses) or from the resistance value RL (m) of the nonvolatile memory element 100.

Here, suppose that the read current in the low resistance state has little degradation when the repeat count of the resistance change operation is 1000 (N=1000) as shown in FIG. 6. In this case, the gate voltage Vg may be changed each time the resistance change operation is repeated 1000 times (each time the resistance change operation is repeated N*m times, where m is a positive integer), for example. Moreover, instead of changing the gate voltage Vg each time the resistance change operation is repeated N*m times, the resistance value RL (m) of the nonvolatile memory element 100 may be measured each time the resistance change operation is repeated N*m times. Then, when the absolute value of ΔRb (m) is larger than or equal to a specified value (corresponding to an upper limit and a lower limit defining a predetermined range), the gate voltage Vg of the transistor 102a may be changed. For example, when ΔRL is 500Ω, the gate voltage may be changed by 0.05 V.

By executing the method described thus far, the operating point of the second local region 105b can be stabilized and the approximately constant low-resistance state can be maintained. Moreover, as described with reference to FIG. 13, the present method has the effect of causing the changed base resistance Rb (m) and the changed resistance value Rfw of the second local region 105b to be close to the initial resistance values, thereby implementing the excellent endurance characteristics.

[1-3. Nonvolatile Memory Device 320]

Figure 19:
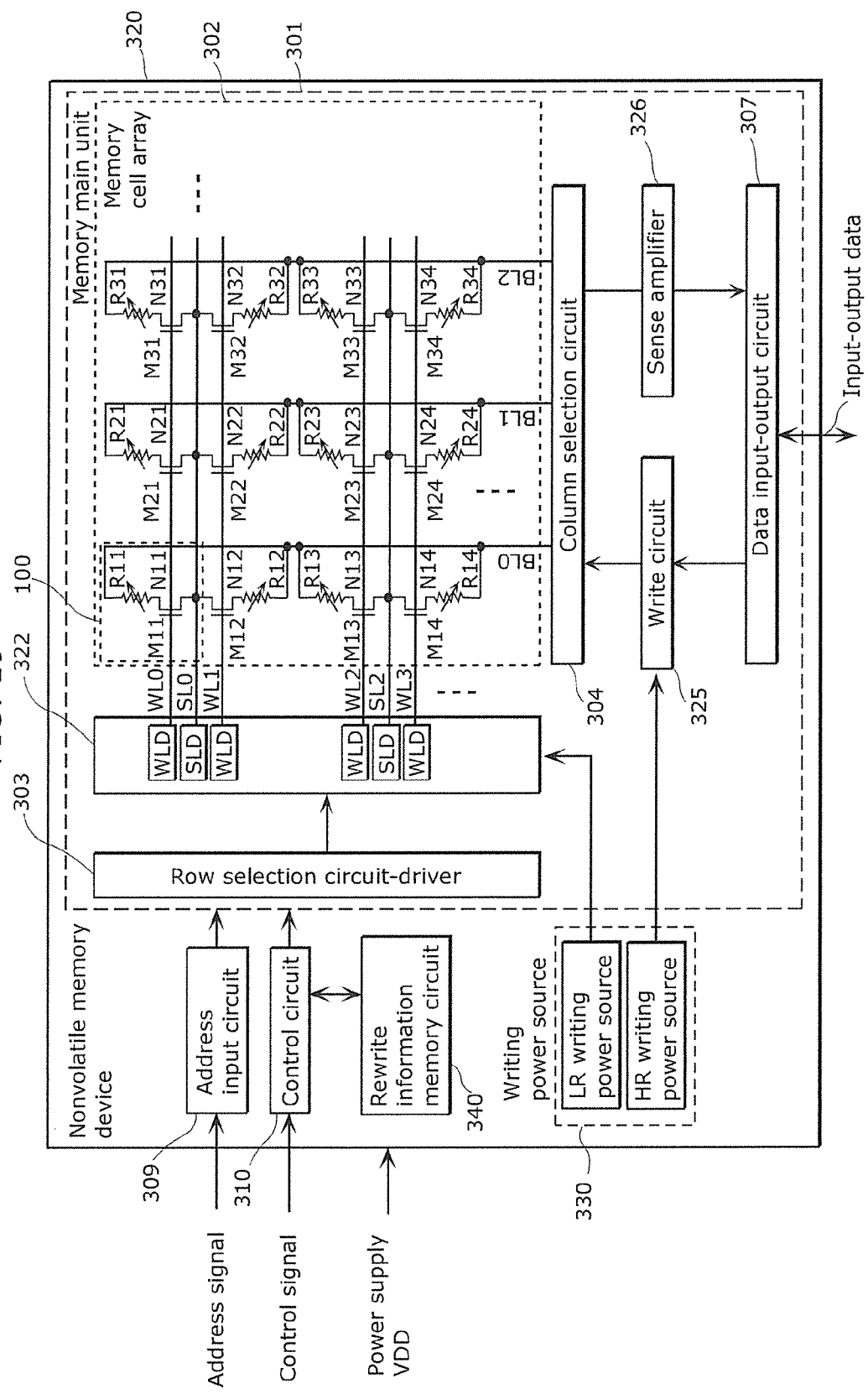
[FIG. 19]

A configuration of a nonvolatile memory device that includes the nonvolatile memory element 100 and executes the method of driving the nonvolatile memory element 100 is described, with reference to FIG. 19.

FIG. 19 is a block diagram showing an example of a configuration of a nonvolatile memory device 320. As shown in FIG. 19, the nonvolatile memory device 320 includes, on a semiconductor substrate (not illustrated): a memory main unit 301; a writing power source 330 which generates a plurality of power sources needed to write data into a memory cell; an address input circuit 309 which receives an address signal from an external source; a control circuit 310 which controls an operation of the memory main unit 301 according to a control signal received from an external source; and a rewrite information memory circuit 340.

The memory main unit 301 includes a memory cell array 302, a row selection circuit-driver 303, a column selection circuit 304, a write circuit 325, a sense amplifier 326, and a data input-output circuit 307. Hereafter, the row selection circuit-driver 303, the column selection circuit 304, the write circuit 325, and the sense amplifier 326 are referred to as the "peripheral circuits" (corresponding to the write voltage application circuit and the read voltage application circuit) as appropriate.

The memory cell array 302 is formed on the semiconductor substrate (not illustrated), and includes: a plurality of word lines WLi (where i=0, 1, 2, . . . and which correspond to word lines WL0, WL1, and WL2 in FIG. 19); a plurality of bit lines BLj (where j=0, 1, 2, . . . and which correspond to bit lines BL0, BL1, and BL2 in FIG. 19); memory cells Mij (each of which is shown as the nonvolatile memory element 100 in FIG. 1A and which correspond to M11, M12, M13, M21, M22, M23, M31, M32, and M33 in FIG. 19); and a plurality of source lines SLi. The word lines WLi are formed in parallel to each other, extending in a first direction in a first plane that is approximately parallel to the main plane of the semiconductor substrate. The bit lines BLj are formed in parallel to each other, extending in a second direction in a second plane parallel to the first plane and three-dimensionally crossing the word lines WLi. The memory cell Mij is provided at each three-dimensional cross point of the word line WLi and the bit line BLj. The source lines SLi are arranged in parallel to the word lines WLi.

Each of the memory cells Mij is shown as the nonvolatile memory element 100 in FIG. 1A. The memory cell Mij includes a variable resistance element Rij (which is shown as the variable resistance element 101 in FIG. 1A and corresponds to R11, R12, R13, R21, R22, R23, R31, R32, and R33 in FIG. 19) and a transistor Nij (which is shown as the transistor 102a included in the current steering element 102 in FIG. 1A and corresponds to N11, N12, N13, N21, N22, N23, N31, N32, and N33 in FIG. 19). The memory cell Mij is configured with one transistor Nij and one variable resistance element Rij, and is thus called a 1T1R type memory cell.

Here, a gate terminal (gate), a drain terminal (drain), and a source terminal (source) of the transistor Nij are connected to the word line WLi, one terminal of the variable resistance element Rij, and the source line SLi, respectively. One terminal of the variable resistance element Rij is connected to the drain of the transistor Nij, and the other terminal of the variable resistance element Rij is connected to the bit line BLj. The aforementioned relationship between the drain and the source is defined only for convenience of description. Therefore, it should be obvious that the drain and the source change places in the relationship according to the direction in which the voltage is applied. A material, a shape, characteristics, and the like of the variable resistance element Rij are the same as those of the variable resistance element 101 described above and shown in FIG. 1A. Similarly, a material, a shape, characteristics, and the like of the transistor Nij are the same as those of the transistor 102a described above and shown in FIG. 1A.

In the memory cell array 302 in the present embodiment, the source line SLi (plate line) is arranged in parallel to the word line WLi. However, it should be noted that the source line SLi may be arranged in parallel to the bit line BLj. Moreover, the source line SLi is configured to apply the same potential to the transistors Nij connected thereto. However, a source line selection circuit-driver having the same configuration as the row selection circuit-driver 303 may be provided and used for driving a selected source line SLh and a nonselected source line SLi with respective different voltages (which may also be different in polarity).

The row selection circuit-driver 303 includes a selection circuit that receives a row address signal outputted from the address input circuit 309 and that selects one of the word lines WLi according to the received row address signal. Then, the row selection circuit-driver 303 applies a predetermined voltage to a selected word line Wh selected by the selection circuit.

The column selection circuit 304 includes a selection circuit that receives a column address signal outputted from the address input circuit 309 and that selects one of the bit lines BLj according to the received column address signal. Then, the column selection circuit 304 applies the write voltage (the first write voltage −VL or the second write voltage VH) or the read voltage to a selected bit line BLk selected by the selection circuit.

The write circuit 325 applies the voltage to the bit line BLj according to a write command outputted from the control circuit 310. For example, in the high-resistance write operation, the write circuit 325 applies the second write voltage VH to the selected bit line BLk selected via the column selection circuit 304.

The sense amplifier 326 detects a resistance value of a selected memory cell Mhk to determine whether the present data is "1" or "0".

The data input-output circuit 307 outputs the data obtained by the sense amplifier 326 to an external source (not illustrated) or the control circuit 310.

The writing power source 330 includes an LR writing power source and an HR writing power source. The HR writing power source generates the second write voltage (HR writing voltage). Similarly, the LR writing power source generates the first write voltage −VL (LR writing voltage).

The address input circuit 309 receives the address signal from the external circuit (not illustrated) under the control of the control circuit 310. According to this address signal, the address input circuit 309 outputs the row address signal to the row selection circuit-driver 303 and also outputs the column address signal to the column selection circuit 304. Here, the address signal indicates an address of a memory cell Mij selected from among the plurality of memory cells Mij. Moreover, the row address signal indicates a row address included in the address indicated by the address signal, and the column address signal indicates a column address included in the address indicated by the address signal.

The control circuit 310 controls the circuits included in the nonvolatile memory device 320 (such as the row selection circuit-driver 303, the column selection circuit 304, the write circuit 325, the sense amplifier 326, and the data input-output circuit 307) to cause the initial breakdown operation, the normal operation (such as the low-resistance write operation or the high-resistance write operation), and the read operation to be executed.

To be more specific, in the normal operation, the control circuit 310 determines from the input data received by the data input-output circuit 307 whether the low-resistance write operation or the high-resistance write operation is to be performed. The control circuit 310 outputs, to the write circuit 325, a write command signal instructing the application of the first write voltage −VL in the case of the low-resistance write operation and a write command signal instructing the application of the second write voltage VH in the case of the high-resistance write operation. Moreover, in the read operation, the control circuit 310 outputs a read command signal instructing the read operation, to the sense amplifier 326 and the column selection circuit 304.

Furthermore, the control circuit 310 in the present embodiment controls the resistance value of the transistor 102*a* by controlling, for example, the row selection circuit-driver 303, the column selection circuit 304, the write circuit 325, the sense amplifier 326, and the data input-output circuit 307. In this case, the voltage to be applied to the gate of the transistor Nij, i.e., the voltage to be applied to the word line WLi is changed.

The rewrite information memory circuit 340 stores various parameters needed to control the resistance value of the transistor 102*a*. The rewrite information memory circuit 340 may be a nonvolatile memory circuit or a rewritable nonvolatile memory circuit.

[1-3-1. Method of Driving Nonvolatile Memory Element 100]

Next, the method of driving the nonvolatile memory element 100 in the present embodiment is described in detail, with reference to FIG. 14 to FIG. 18.

OPERATION EXAMPLE 1

Figure 14:
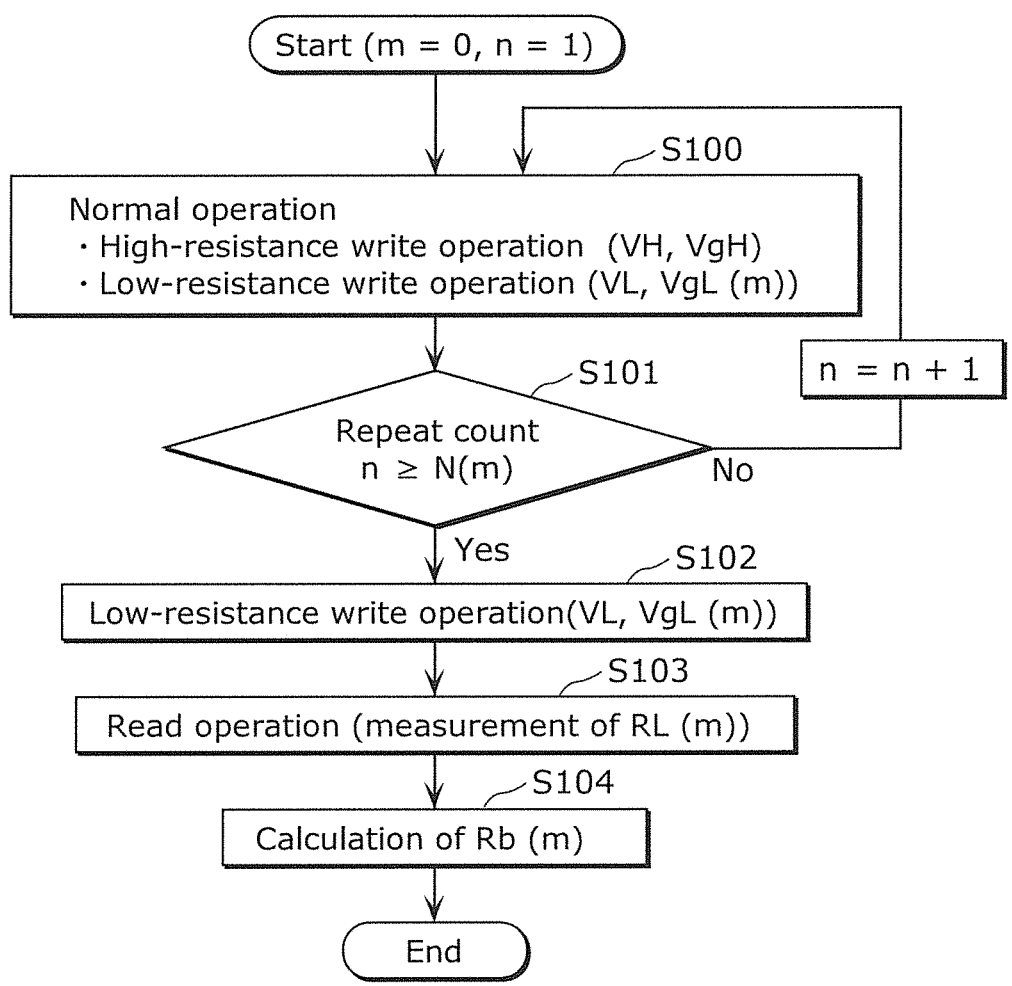
[FIG. 14]
Figure 15:
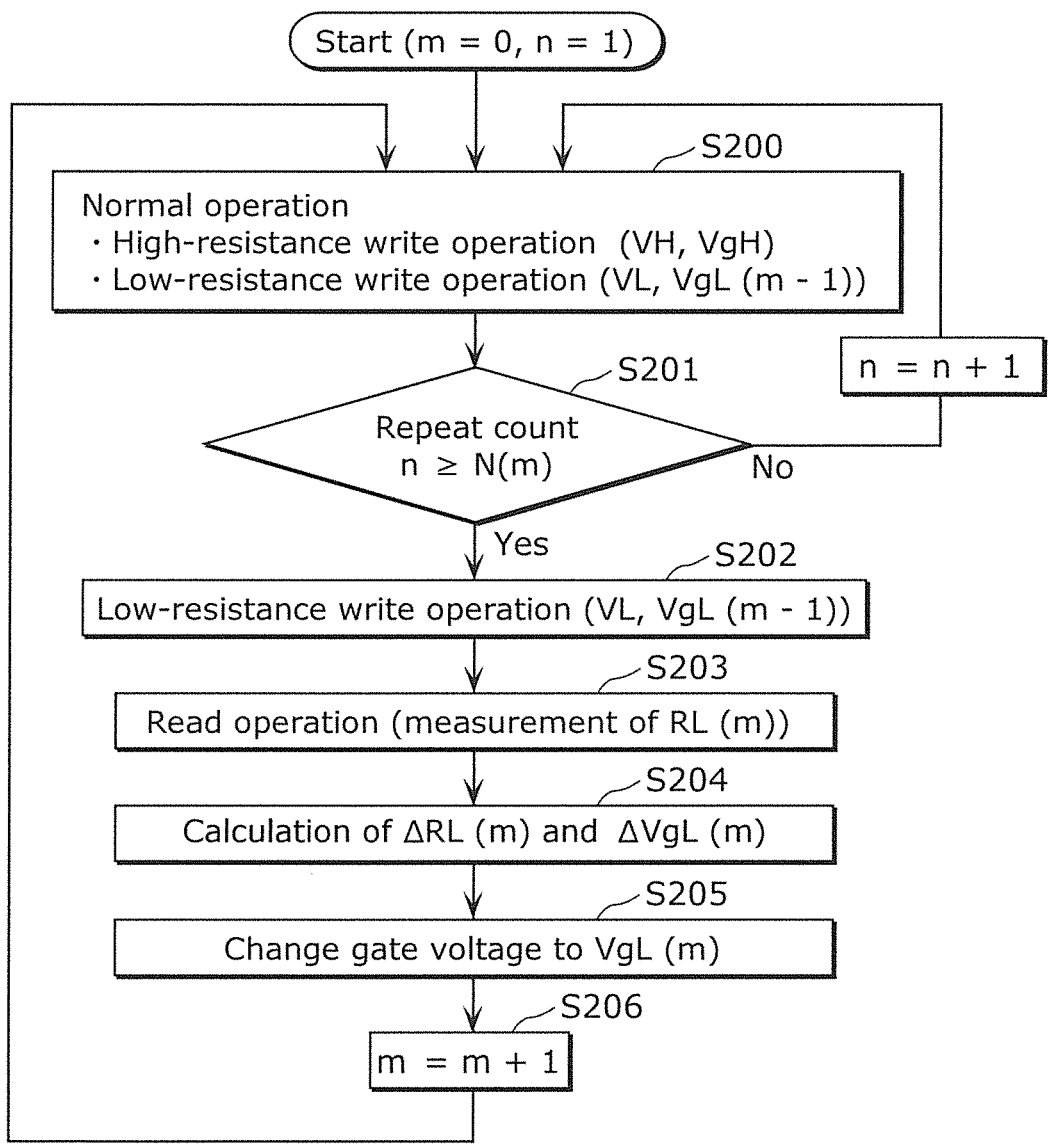
[FIG. 15]

Operation Example 1 describes the case where the resistance value (the gate voltage) of the transistor Nij (the transistor 102*a*) is changed (optimized) on the basis of the amount of change ΔRL in the resistance value of the nonvolatile memory element 100 overall, with reference to FIG. 14 and FIG. 15.

In the present embodiment, after the base resistance Rb (0) serving as a reference is firstly calculated, the gate voltage of the transistor Nij is changed using this reference base resistance Rb (0).

The method of calculating the reference base resistance Rb (0) is described with reference to the flowchart shown in FIG. 14. The reference base resistance Rb (0) is calculated firstly after the initial breakdown operation is performed on the nonvolatile memory element 100. Here, the method of driving the nonvolatile memory element 100 in the present embodiment is executed by, for example, the nonvolatile memory device 320 shown in FIG. 19. Therefore, this driving method is described with reference to FIG. 19 as necessary.

When the calculation of the reference base resistance Rb (0) is started, the control circuit 310 sets the values of variables m and n as m=0 and n=1.

As shown in FIG. 14, the control circuit 310 controls the write circuit 325 and others to execute, under a predetermined driving condition, the high-resistance write operation or the low-resistance write operation on the variable resistance element Rhk included in the selected memory cell Mhk (Step S100).

The initial driving condition of the low-resistance write operation is set as follows for example: the first write voltage −VL is set to −2.0 V; the pulse width of the first write voltage −VL is set to 100 ns; and the gate voltage Vg (VgL) of the transistor Nij is set to +2.4 V. Moreover, the driving condition of the high-resistance write operation is set as follows for example: the second write voltage VH is set to +2.0 V; the pulse width of the second write voltage VH is set to 100 ns; and the gate voltage Vg (VgH) of the transistor Nij is set to +2.4 V.

After executing the normal operation (Step S100), the control circuit 310 determines whether or not a repeat count "n" indicating the number of voltage applications to the variable resistance element Rij is larger than or equal to N (0) times (Step S101). Here, the voltage applications counted in the number of voltage applications include the applications of the initial breakdown voltage, the first write voltage −VL, and the second write voltage VH. The read voltage application is not counted in the number of voltage applications. Moreover, N (m) is appropriately set according to the characteristics of the variable resistance element Rij as shown in FIG. 6. For purposes of explanation, N (m) is always the same regardless of m in the present embodiment. However, this is not intended to be limiting.

When the repeat count n is smaller than N (0) times (the flow branches to "No" in Step S101), the control circuit 310 increments n by 1 and proceeds to Step S100.

When the repeat count n is larger than or equal to N (0) times (the flow branches to "Yes" in Step S101), the control circuit 310 performs the low-resistance write operation (Step S102) and the read operation (Step S103). Here, the driving condition of the low-resistance write operation and the read operation is the same as the driving condition of the normal operation.

Next, the control circuit 310 calculates the initial value Rb (0) of the base resistance using the resistance value RL (0) read in the read operation, according to Equation 4 described above (Step S104). Here, the value of N (0) may be set to a value that does not cause any degradation in the endurance characteristics of the variable resistance element Rij (the variable resistance element 101). For example, when the variable resistance element 101 has the endurance characteristics shown in FIG. 6, the value of N (0) is at least 1 and no more than 1000. Moreover, the initial value Rb (0) of the base resistance may be calculated based on the read operation performed for the first time after the voltage application is performed N (0) times (Step S103). Alternatively, the voltage application may be performed multiple sets of N (0) times, and an average value of the resistance values read in these operations may be used as the initial value Rb (0) of the base resistance.

Note that the initial value Rb (0) of the base resistance should be calculated after the initial breakdown operation is performed on the nonvolatile memory element 100. Thus, the initial value Rb (0) of the base resistance may be calculated in the measurement after shipment, or calculated in advance using an element sampled in an inspection process before shipment. When the base resistance Rb (0) is calculated in the inspection process before shipment, this calculated reference base resistance Rb (0) may be stored in the rewrite information memory circuit 340, the memory cell array 302, a fuse circuit, or the like.

Next, the control circuit 310 changes the gate voltage of the transistor Nij using the reference base resistance Rb (0). FIG. 15 is a flowchart showing a method of changing the gate voltage of the transistor Nij after the base resistance Rb (m) is calculated.

As shown in FIG. 15, after calculating the base resistance Rb (0) serving as a reference, the control circuit 310 initializes the values of the variables m and n as n=1 and m=1.

The control circuit 310 controls the write circuit 325 and others to execute, under a predetermined driving condition, the high-resistance write operation or the low-resistance write operation on the variable resistance element Rhk included in the selected memory cell Mhk (Step S200). The driving condition used here is the same as the driving condition used in Step S100.

After executing the normal operation (Step S200), the control circuit 310 determines whether or not the repeat count n is larger than or equal to N (m) times (Step S201). Here, the value of N (m) is set according to the endurance characteristics of the variable resistance element 101. For example, the value of N (m) may be set based on the repeat count of when the endurance characteristics start to degrade. To be more specific, in the cases shown in FIG. 6, since the read current varies and slightly decreases to show the degradation tendency when the repeat count is $10^4$ times, the value of N (m) is set to $10^4$ or lower. When the value of N (m) is too small, the gate voltage is to be changed frequently even without signs of degradation and thus the load on the control circuit 310 and the like increases. On account of this, the value of N (m) may be set to a value that is large to some extent. In the case shown in FIG. 6, although the read current does not decrease and shows variation of below 10% when the repeat count is $10^2$ times or less, the variation in the read current exceeds 10% when the repeat count is $10^3$ times or more. On account of this, the value of N (m) is set to, for example, at least $10^3$ times where the variation in the read current starts increasing. Accordingly, when the variable resistance element 101 has the endurance characteristics shown in FIG. 6, the value of N (m) is set to at least 1000 and no more than 10000. Moreover, the value of N (m) may be the same for each m, or may be different for each m.

When the repeat count n is smaller than N (m) times (the flow branches to "No" in Step S201), the control circuit 310 increments n by 1 and proceeds to Step S200.

When the repeat count n is larger than or equal to N (m) times (the flow branches to "Yes" in Step S201), the control circuit 310 performs the low-resistance write operation (Step S202). Here, as the driving condition of the low-resistance write operation: the first write voltage $-VL$ is set to $-2.0$ V; and the pulse width is set to 100 ns. Moreover, the gate voltage VgL (m−1) is applied to the gate of the transistor Nij.

Furthermore, the control circuit 310 performs the read operation (Step S203), and calculates the resistance value RL (m) of the nonvolatile memory element 100 overall. Here, the driving condition of the read operation is the same as the driving condition of the normal operation.

Next, the control circuit 310 calculates the absolute value of $\Delta RL$ (m) (as a part of Step S204). The amount of change $\Delta RL$ (m) in the resistance value of the nonvolatile memory element 100 overall is calculated by subtracting the last resistance value RL (m−1) from the present resistance value RL (m). It should be noted that $\Delta RL$ (m) may also be calculated by RL (m)−RL (0).

Moreover, the control circuit 310 calculates $\Delta VgL$ (m) according to Equation 15 below (as a part of Step S204).

$$\Delta VgL(m)=(VL-Vt-VR)/(Rtw+Rb(0))*\Delta RL(m)/(1+\alpha\beta) \quad \text{Equation 15}$$

After calculating $\Delta VgL$ (m), the control circuit 310 obtains VgL (m) by calculating VgL (m−1)+$\Delta VgL$ (m), and changes the gate voltage of the transistor Nij that is the driving condition of the low-resistance write operation, to VgL (m) (as optimization in Step S205).

After performing the optimization in Step S205, the control circuit 310 increments the value of m by 1 and proceeds to Step S200 (Step S206).

In Operation Example 1, the value of the gate voltage of the transistor Nij is optimized whenever the voltage application is performed N (m) times. Therefore, the resistance value of the variable resistance element 101 after the low-resistance write operation can be maintained in the approximately constant low-resistance state. Note that m represents the number of times the resistance value of the transistor Nij is optimized.

In Operation Example 1 as described thus far, the control circuit 310 calculates the amount of change $\Delta VgL$ (m) in the gate voltage of the transistor Nij corresponding to the amount of change $\Delta RL$ (m) in the resistance value of the nonvolatile memory element 100 overall, and changes the gate voltage according to the calculated amount of change $\Delta VgL$ (m). As a result, the resistance value of the nonvolatile memory element 100 overall can be changed to be close to the certain range.

OPERATION EXAMPLE 2

Figure 16:
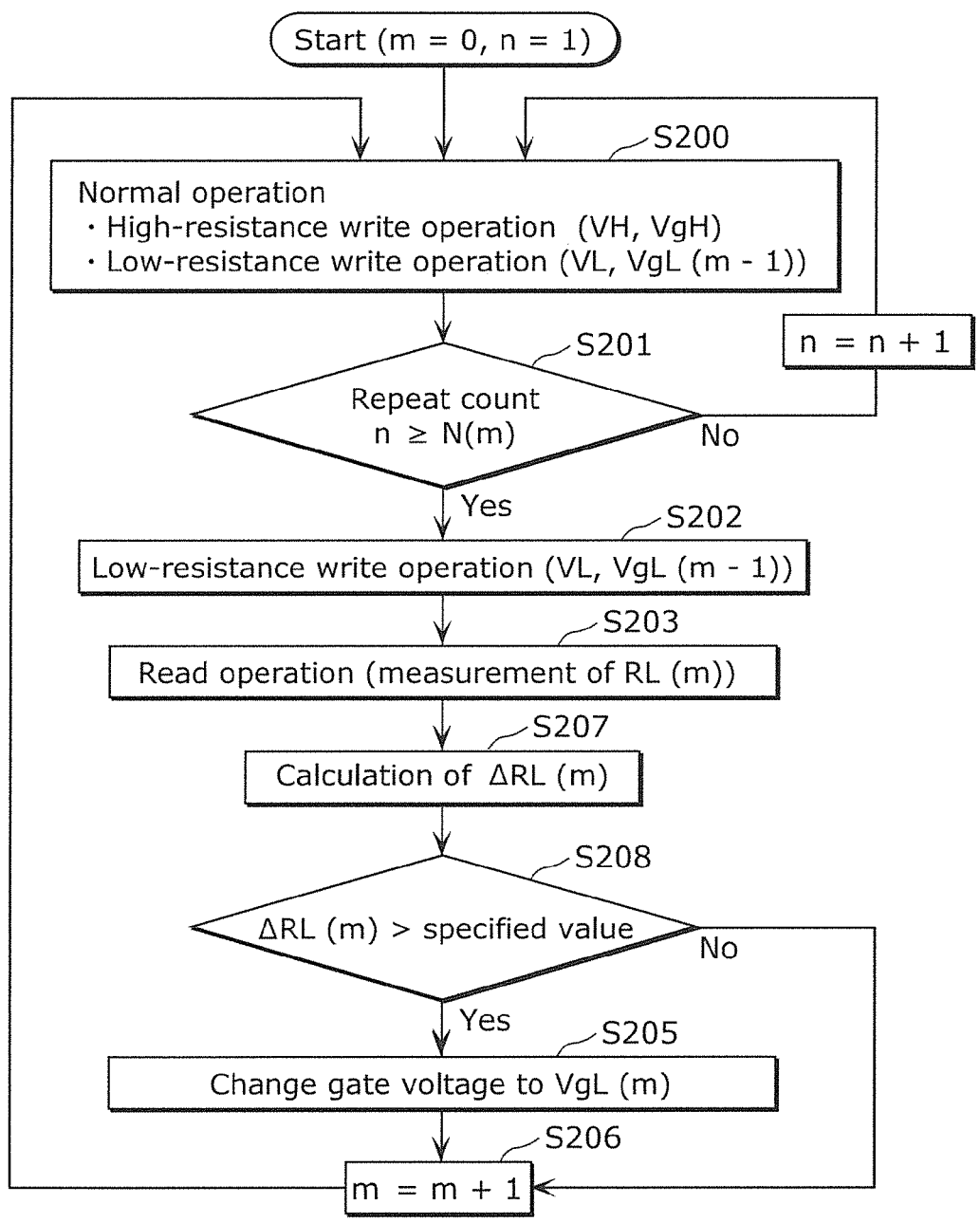
[FIG. 16]

Operation Example 2 describes, with reference to FIG. 16, the case where whether or not to perform the optimization is determined whenever the voltage application is performed N (m) times and where the optimization is performed only when it is determined that the optimization should be performed. Thus, unlike Operation Example 1, the optimization is not performed whenever the voltage application is performed N (m) times.

As in Operation Example 1, after the reference base resistance Rb (0) is firstly calculated, the gate voltage of the transistor Nij is similarly changed using this calculated reference base resistance Rb (0) in Operation Example 2. The method of calculating the reference base resistance Rb (0) is the same as the calculation method described with reference to FIG. 14 in Operation Example 1.

FIG. 16 is a flowchart showing a method of changing the gate voltage of the transistor Nij after the base resistance Rb (m) is calculated.

The control circuit 310 executes, under the predetermined driving condition, the high-resistance write operation or the low-resistance write operation on the variable resistance element Rhk included in the selected memory cell Mhk (Step S200). The driving condition used here is the same as the driving condition used in Step S100.

After executing the normal operation (Step S200), the control circuit 310 determines whether or not the repeat count n is larger than or equal to N (m) times (Step S201). Here, the value of N (m) may be set to at least 1 and no more than 10000 ($10^4$) in Operation Example 2. Here, the value of N (m) is set to at least $10^3$ in Operation Example 1. However, in Operation Example 2, since the optimization is not performed each time, the value of N (m) only has to be at least 1.

When the repeat count n is smaller than N (m) times (the flow branches to "No" in Step S201), the control circuit 310 increments n by 1 and proceeds to Step S200.

When the repeat count n is larger than or equal to N (m) times (the flow branches to "Yes" in Step S201), the control circuit 310 performs the low-resistance write operation (Step S202). Here, as the driving condition of the low-resistance write operation: the first write voltage −VL is set to −2.0 V; and the pulse width is set to 100 ns. Moreover, the gate voltage VgL (m−1) is applied to the gate of the transistor Nij.

Furthermore, the control circuit 310 performs the read operation (Step S203), and calculates RL (m). Here, the driving condition of the read operation is the same as the driving condition of the normal operation.

Next, in Operation Example 2, the control circuit 310 calculates the absolute value of ΔRL (m) (Step S207). The amount of change ΔRL (m) in the resistance value of the nonvolatile memory element 100 overall is calculated by subtracting the last resistance value RL (m−1) from the present resistance value RL (m). It should be noted that ΔRL (m) may also be calculated by RL (m)−RL (0).

The control circuit 310 determines whether or not the absolute value of ΔRL (m) is larger than or equal to a specified value (corresponding to an upper limit and a lower limit defining a predetermined range) (Step 208).

When determining that the absolute value of ΔRL (m) is larger than the specified value that is predetermined (the flow branches to "Yes" in Step S208), the control circuit 310 calculates ΔVgL (m) according to Equation 15 described above and then calculates VgL (m). Following this, the control circuit 310 changes the gate voltage of the transistor Nij that is the driving condition of the low-resistance write operation, to VgL (m) (as optimization in Step S205). The specified value is set to, for example, 500Ω. Here, as described above regarding the method of changing the resistance value of the transistor Nij (see Equation 12), when ΔRL (m) is 500Ω, the gate voltage ΔVgL of the transistor Nij is 0.05 V.

When determining that the absolute value of ΔRL (m) is smaller than or equal to the specified value in Step 208 (the flow branches to "No" in Step S208) or after performing the optimization in Step S205, the control circuit 310 increments the value of m by 1 and proceeds to Step S200 (Step S206).

As in Operation Example 1, in Operation Example 2 as described thus far, the control circuit 310 calculates the amount of change ΔVgL (m) in the gate voltage of the transistor Nij corresponding to the amount of change ΔRL (m) in the resistance value of the nonvolatile memory element 100 overall, and changes the gate voltage according to the calculated amount of change ΔVgL (m). As a result, the resistance value of the nonvolatile memory element 100 overall can be changed to be close to the certain range.

The present operation example describes the case where the amount of change ΔRL (m) in the resistance value is compared with the specified value (the upper limit and the lower limit of the amount of change have the same value). However, this is not intended to be limiting. The upper limit and the lower limit (a negative value) of the amount of change ΔRL (m) may be different. Alternatively, only either one of the upper and lower limits may be specified.

OPERATION EXAMPLE 3

Figure 17:
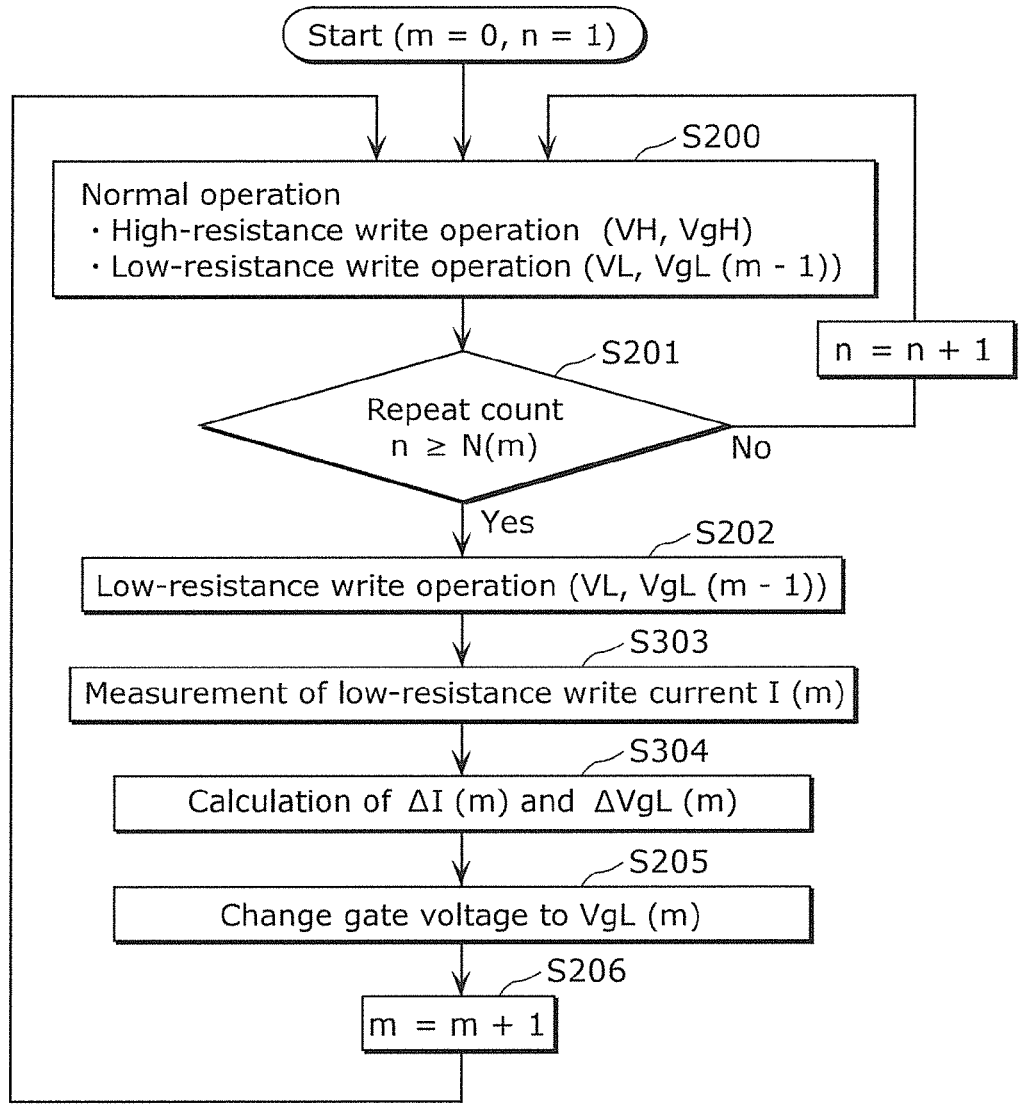
[FIG. 17]

Operation Example 3 describes the case where the resistance value of the transistor Nij is changed (optimized) on the basis of the current I passing through the variable resistance element Rij in the low-resistance write operation, with reference to FIG. 17. The optimization performed by measuring the current I (m) can be implemented using Equation 7 to Equation 10 described above.

As in Operation Example 1, after the reference base resistance Rb (0) is firstly calculated, the gate voltage of the transistor Nij is similarly changed using this calculated reference base resistance Rb (0) in Operation Example 3. The method of calculating the reference base resistance Rb (0) is the same as the calculation method described with reference to FIG. 14 in Operation Example 1.

FIG. 17 is a flowchart showing the method of changing the gate voltage of the transistor Nij by measuring the current I (m) after the base resistance Rb (m) is calculated.

The control circuit 310 executes, under the predetermined driving condition, the high-resistance write operation or the low-resistance write operation on the variable resistance element Rhk included in the selected memory cell Mhk (Step S200). The driving condition used here is the same as the driving condition used in Step S100.

After executing the normal operation (Step S200), the control circuit 310 determines whether or not the repeat count n is larger than or equal to N (m) times (Step S201). Here, in Operation Example 3, the optimization is performed each time the voltage application is performed N (m) times as in Operation Example 1. Therefore, the value of N (m) may be set to at least 1000 ($10^3$) and no more than 10000 ($10^4$) in Operation Example 3.

When the repeat count n is smaller than N (m) times (the flow branches to "No" in Step S201), the control circuit 310 increments n by 1 and proceeds to Step S200.

When the repeat count n is larger than or equal to N (0) times (the flow branches to "Yes" in Step S201), the control circuit 310 in Operation Example 3 performs the low-resistance write operation (Step S202) and measures the current I (m) passing through the variable resistance element 101 in the low-resistance write operation (Step S303). Here, as the driving condition of the low-resistance write operation: the first write voltage −VL is set to −2.0 V; and the pulse width is set to 100 ns. Moreover, the gate voltage VgL (m−1) is applied to the gate of the transistor Nij.

Moreover, in Operation Example 3, the control circuit 310 calculates the amount of change ΔVgL (m) in the gate voltage VgL of the transistor Nij on the basis of the current I (m) measured in Step S303 (Step S304).

To be more specific, according to Equation 10 described above, the amount of change in the gate voltage VgL of the transistor Nij is calculated from an amount of change ΔI (m) in the current I (m) passing through the variable resistance element 101 in the low-resistance write operation. The amount of change ΔI (m) in the current is obtained by calculating I (m)−I (m−1). The amount of change ΔVgL (m) in the gate voltage VgL is calculated according to Equation 16 below.

$$\Delta VgL(m) = -\Delta I(m) * (Rtw + Rb(0))$$ Equation 16

Here, when the variable resistance element 101 has the characteristics shown in FIG. 10A to FIG. 10C, Rtw is 4.5Ω and the median value of the base resistance Rb (0) is 552Ω. By substituting these values into Equation 16, Equation 17 below can be obtained.

$$\Delta VgL(m) = -5052 * \Delta I(m)$$ Equation 17

Thus, when the current I flowing in the low-resistance write operation changes by about 10 μA (ΔI (m)=10 μA) for example, the gate voltage VgL (m) of the transistor Nij may be changed by about 0.05 V. Moreover, when the current I flowing in the low-resistance write operation changes by about 20 μA for example, the gate voltage VgL of the transistor Nij may be changed by about 0.1 V.

After calculating ΔVgL (m), the control circuit 310 obtains VgL (m) by calculating VgL (m−1)+ΔVgL (m), and changes the gate voltage of the transistor Nij that is the driving condition of the low-resistance write operation, to VgL (m) (as optimization in Step S205).

After performing the optimization in Step S205, the control circuit 310 increments the value of m by 1 and proceeds to Step S200 (Step S206).

In Operation Example 3 as described thus far, the control circuit 310 calculates the amount of change ΔVgL (m) in the gate voltage of the transistor Nij corresponding to the amount of change ΔI (m) in the current I (m) passing through the variable resistance element 101 in the low-resistance write operation, and changes the gate voltage according to the calculated amount of change ΔVgL (m). As a result, the amount of current passing through the variable resistance element 101 can be changed to be close to the certain range.

OPERATION EXAMPLE 4

Figure 18:
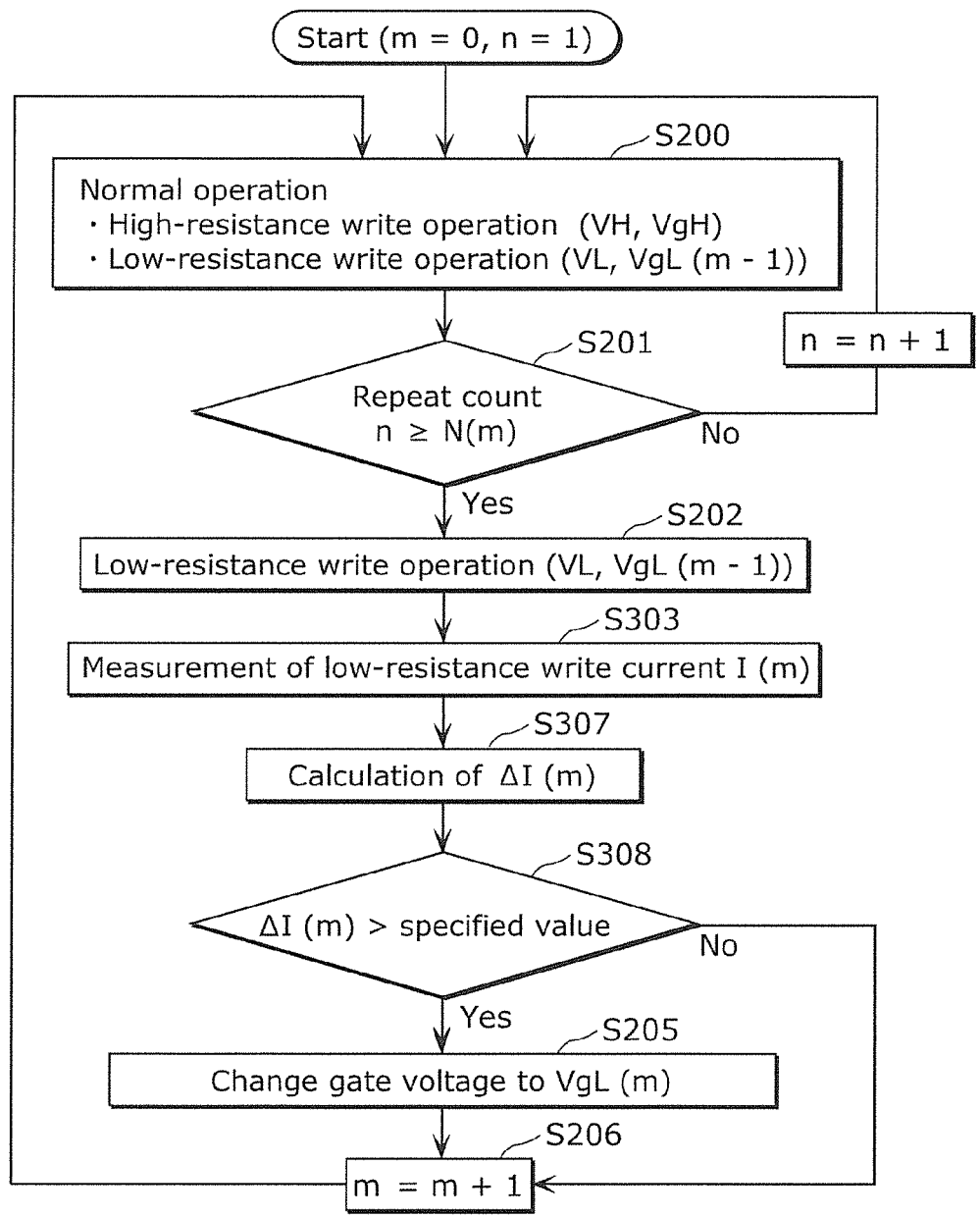
[FIG. 18]

Operation Example 4 describes, with reference to FIG. 18, the case where the optimization is performed by measuring ΔI (m) as in Operation Example 3. However, instead of performing the optimization each time the voltage application is performed N (m) times, whether or not to perform the optimization is determined each time the voltage application is performed N (m) times. Then, in Operation Example 3, the optimization is performed only when it is determined that the optimization should be performed.

As in Operation Example 1 to Operation Example 3, after the reference base resistance Rb (0) is firstly calculated, the gate voltage of the transistor Nij is similarly changed using this calculated reference base resistance Rb (0) in Operation Example 4. The method of calculating the reference base resistance Rb (0) is the same as the calculation method described with reference to FIG. 14 in Operation Example 1.

FIG. 18 is a flowchart showing the method of changing the gate voltage of the transistor Nij by measuring the current I (m) after the base resistance Rb (m) is calculated.

The control circuit 310 executes, under the predetermined driving condition, the high-resistance write operation or the low-resistance write operation on the variable resistance element Rhk included in the selected memory cell Mhk (Step S200). The driving condition used here is the same as the driving condition used in Step S100.

After executing the normal operation (Step S200), the control circuit 310 determines whether or not the repeat count n is larger than or equal to N (m) times (Step S201). Here, in Operation Example 4, the value of N (m) may be set to at least 1 and no more than 10000 ($10^4$) as in Operation Example 2.

When the repeat count n is smaller than N (m) times (the flow branches to "No" in Step S201), the control circuit 310 increments n by 1 and proceeds to Step S200.

When the repeat count n is larger than or equal to N (0) times (the flow branches to "Yes" in Step S201), the control circuit 310 in Operation Example 4 performs the low-resistance write operation (Step S202) and measures the current I (m) passing through the variable resistance element 101 in the low-resistance write operation (Step S303). Here, as the driving condition of the low-resistance write operation: the first write voltage −VL is set to −2.0 V; and the pulse width is set to 100 ns. Moreover, the gate voltage VgL (m−1) is applied to the gate of the transistor Nij.

Next, in Operation Example 4, the control circuit 310 calculates the amount of change ΔI (m) in the current I (m) passing through the variable resistance element 101 in the low-resistance write operation, on the basis of the current I (m) measured in Step S303 (Step S307). The amount of change ΔI (m) in the current is calculated by subtracting the last amount of current I (m−1) from the present amount of current I (m). It should be noted that ΔI (m) may also be calculated by subtracting the reference amount of current I (0) from the present amount of current I (m).

Moreover, the control circuit 310 determines whether or not the absolute value of ΔI (m) is larger than or equal to a specified value (corresponding to an upper limit and a lower limit defining a predetermined range) (Step 308).

When determining that the absolute value of ΔI (m) is larger than the specified value that is predetermined (the flow branches to "Yes" in Step S308), the control circuit 310 calculates ΔVgL (m) according to Equation 17 described above and then calculates VgL (m). Following this, the control circuit 310 changes the gate voltage of the transistor Nij that is the driving condition of the low-resistance write operation, to VgL (m) (as optimization in Step S205). When the current I flowing in the low-resistance write operation changes by about 10 μA (ΔI (m)=10 μA) for example, the gate voltage VgL (m) of the transistor Nij may be changed by about 0.05 V.

When determining that the absolute value of ΔI (m) is smaller than or equal to the specified value in Step 308 (the flow branches to "No" in Step S308) or after performing the optimization in Step S205, the control circuit 310 increments the value of m by 1 and proceeds to Step S200 (Step S206).

As in Operation Example 3, in Operation Example 4 as described thus far, the control circuit 310 calculates the amount of change ΔVgL (m) in the gate voltage of the transistor Nij corresponding to the amount of change ΔI (m) in the current I (m) passing through the variable resistance element 101 in the low-resistance write operation, and changes the gate voltage according to the calculated amount of change ΔVgL (m). As a result, the amount of current passing through the variable resistance element 101 can be changed to be close to the certain range.

The present operation example describes the case where the amount of change ΔI (m) in the amount of current is compared with the specified value (the upper limit and the lower limit of the amount of change have the same value) in Step S308. However, this is not intended to be limiting. The upper limit and the lower limit (a negative value) of the amount of change ΔI (m) may be different. Alternatively, only either one of the upper and lower limits may be specified.

As described thus far, by executing Operation Example 1 to Operation Example 4, the low-resistance write voltage applied to the second local region 105b can be kept constant and the operating point of the second local region 105b shown in FIG. 13 can be maintained approximately constant. To be more specific, the low resistance state of the nonvolatile memory element 100 can be maintained approximately constant. Moreover, as described above, the present method has the effect of causing the changed base resistance Rb (m) and the changed resistance value Rfw of the second local region 105b to be close to the initial resistance values, thereby implementing the excellent endurance characteristics.

Operation Example 1 to Operation Example 4 describe, as the method of changing the resistance value of the transistor Nij, the case where the amount of change in the gate voltage corresponding to the amount of change in the resistance value or in the amount of current is calculated according to the correlation stored in advance in the nonvolatile memory device. More specifically, the correlation between the amount of change in the resistance value or in the amount of current and the amount of change in the gate voltage is stored in advance. However, this is not intended to be limiting.

The correlation is not limited to Equations (Equation 15 and Equation 16). The correlation may be represented by a different expression, a table, or the like. Moreover, the amount of change ΔVgL (m) in the gate voltage may be, for example, a predetermined value or a predetermined ratio (such as 10%) with respect to the present gate voltage or the initial gate voltage. Furthermore, in Operation Example 1 to Operation Example 4 above, the changed gate voltage VgL (m) is calculated after the amount of change ΔVgL (m) in the gate voltage is calculated. However, the gate voltage VgL (m) may be directly calculated.

[Embodiment 2]

Next, a nonvolatile memory device according to Embodiment 2 is described.

A nonvolatile memory device 400 in Embodiment 2 is different from the nonvolatile memory device 320 in Embodiment 1 above in that a transistor 102a included in a current steering element 102 is provided outside a memory cell instead of inside the memory cell.

Figure 20:
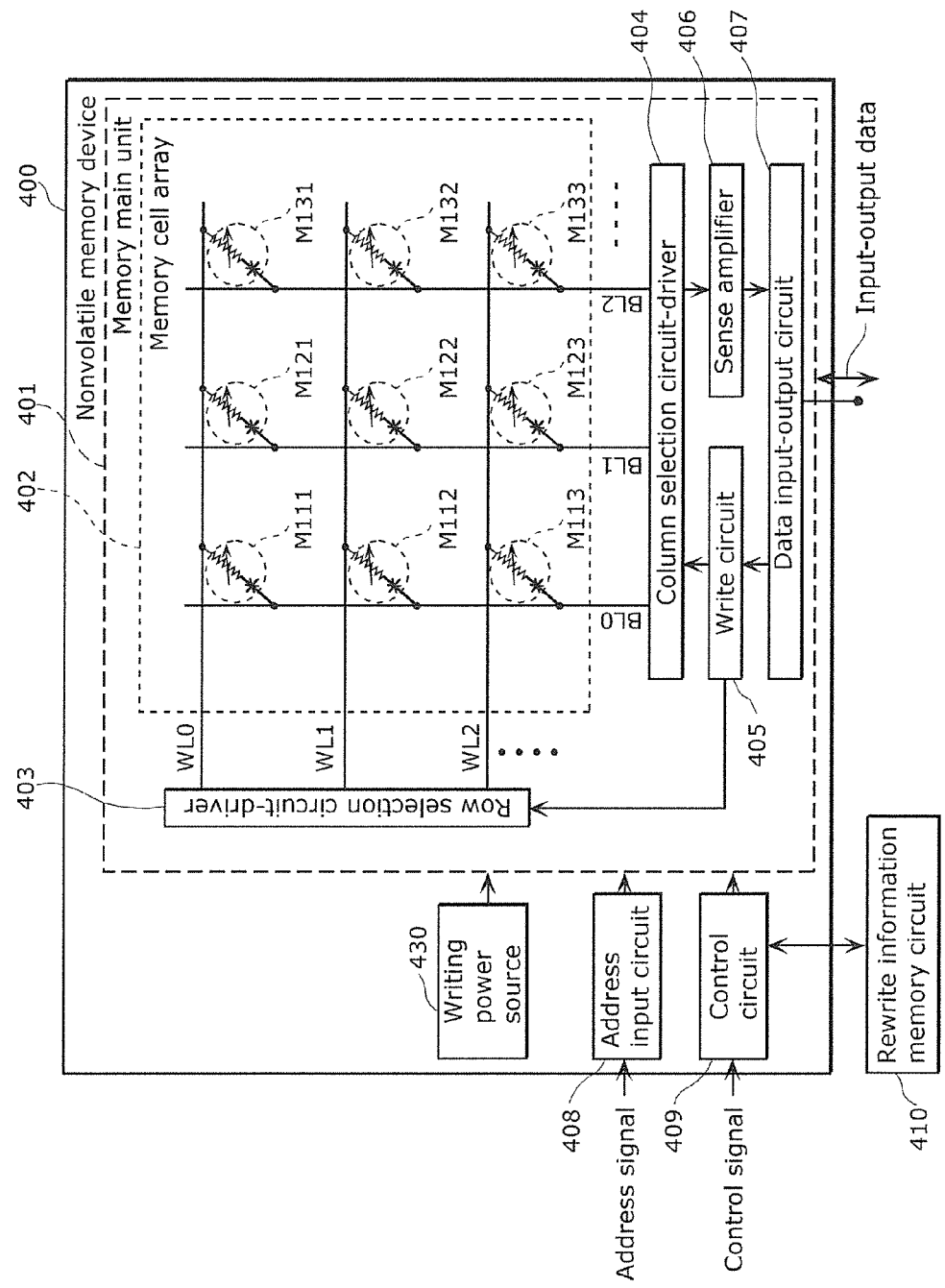
[FIG. 20]

FIG. 20 is a block diagram showing an example of a configuration of the nonvolatile memory device 400. As shown in FIG. 20, the nonvolatile memory device 400 in the present embodiment includes, on a semiconductor substrate (not illustrated): a memory main unit 401; a writing power source 430 which generates a plurality of power sources needed to write data into a memory cell; an address input circuit 408 which receives an address signal from an external source; a control circuit 409 which controls an operation of the memory main unit 401 according to a control signal received from an external source; and a rewrite information memory circuit 410. It should be noted that the configuration of the writing power source 430 is the same as the configuration of the writing power source 330 shown in FIG. 19, and that the configuration of the address input circuit 408 is the same as the configuration of the address input circuit 309 shown in FIG. 19.

The memory main unit 401 includes a memory cell array 402, a row selection circuit-driver 403, a column selection circuit-driver 404, a write circuit 405, a sense amplifier 406, and a data input-output circuit 407. Hereafter, in the present embodiment, the row selection circuit-driver 403, the column selection circuit-driver 404, the write circuit 405, and the sense amplifier 406 are referred to as the "peripheral circuits" (corresponding to the write voltage application circuit and the read voltage application circuit) as appropriate. The configuration of the row selection circuit-driver 403 is the same as the configuration of the row selection circuit-driver 303 shown in FIG. 19. The configuration of the column selection circuit-driver 404 is the same as the configuration of the column selection circuit 304 shown in FIG. 19. The configuration of the write circuit 405 is the same as the configuration of the write circuit 325 shown in FIG. 19. The configuration of the sense amplifier 406 is the same as the configuration of the sense amplifier 326 shown in FIG. 19. The configuration of the data input-output circuit 407 is the same as the configuration of the data input-output circuit 307 shown in FIG. 19.

The memory cell array 402 is formed on the semiconductor substrate (not illustrated), and includes: a plurality of word lines WLi (where i=0, 1, 2, . . . and which correspond to word lines WL0, WL1, and WL2 in FIG. 20); a plurality of bit lines BLj (where j=0, 1, 2, . . . and which correspond to bit lines BL0, BL1, and BL2 in FIG. 20); and memory cells M1ij. The word lines WLi are formed in parallel to each other, extending in a first direction in a first plane that is approximately parallel to the main plane of the semiconductor substrate. The bit lines BLj are formed in parallel to each other, extending in a second direction in a second plane parallel to the first plane and three-dimensionally crossing the word lines WLi. The memory cell M1ij is provided at each three-dimensional cross point of the word line WLi and the bit line BLj.

The memory cell M1ij includes a variable resistance element and a current steering element configured with a selection diode. The memory cell M1ij is configured with one diode and one variable resistance element, and is thus called a 1D1R type memory cell.

One terminal of the selection diode of the memory cell M1ij is connected to the bit line BLj, and the other terminal of the selection diode of the memory cell M1ij is connected to one terminal of the variable resistance element. One terminal of the variable resistance element of the memory cell M1ij is connected to the word line WLi, and the other terminal of the variable resistance element of the memory cell M1ij is connected to the other terminal of the variable resistance element. A material, a shape, characteristics, and the like of the variable resistance element are the same as those of the variable resistance element 101 described above and shown in FIG. 1A.

The diode of the memory cell M1ij shown in FIG. 20 is a bidirectional metal-semiconductor-metal (MSM) diode. Here, the bidirectional diode has nonlinear voltage-current characteristics as follows. Regardless of whether positively biased or negatively biased, the bidirectional diode enters an ON state when a voltage having an absolute value larger than or equal to a predetermined threshold is applied and enters an OFF state when a voltage having an absolute value smaller than the predetermined threshold is applied. The MSM (metal-semiconductor-metal) diode is one type of bidirectional diodes and has a structure where a semiconductor layer is arranged between one pair of electrodes.

The control circuit 409 controls the circuits included in the nonvolatile memory device 400 (such as the row selection circuit-driver 403, the column selection circuit-driver 404, the write circuit 405, the sense amplifier 406, and the data input-output circuit 407) to cause the initial breakdown operation, the normal operation (such as the low-resistance write operation or the high-resistance write operation), and the read operation to be executed.

Moreover, the control circuit 409 stores data including an upper limit (corresponding to N (m) in Embodiment 1) of the repeat count that is separately stored and the repeat count (corresponding to n in Embodiment 1), into the rewrite information memory circuit 410. The control circuit 409 calculates ΔVgL (m) according to the method described in Embodiment 1 and stores the calculated (m) into the rewrite information memory circuit 410.

In the present embodiment, the memory cell does not include a transistor. Therefore, the control circuit 409 changes a gate voltage of a transistor included in a peripheral circuit (such as the row selection circuit-driver 403 or the column selection circuit-driver 404) connected in series with the memory cell.

Figure 1B:
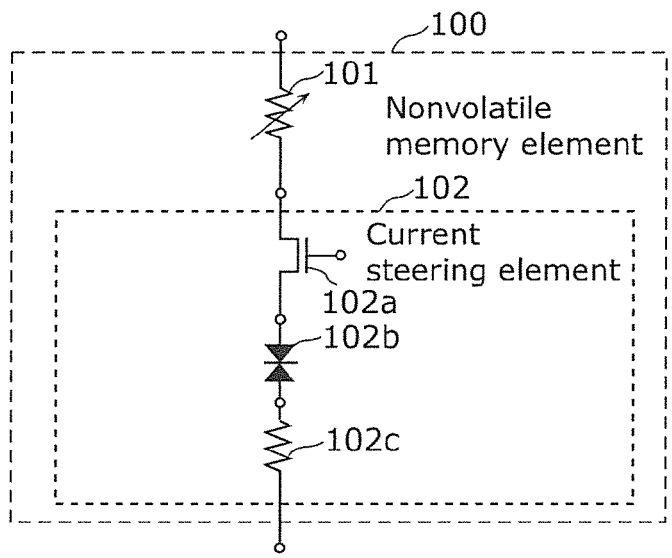
[FIG. 1B]

Here, FIG. 1B is a circuit diagram showing an example of a configuration of a nonvolatile memory element 100 in the present embodiment. As shown in FIG. 1B, the nonvolatile memory element 100 is configured with a variable resistance element 101 and a current steering element 102 that are connected in series. Moreover, the current steering element 102 is configured with a transistor 102a, a bidirectional diode 102b, and a fixed resistor 102c that are connected in series, as shown in FIG. 1B. Here, as mentioned above, the transistor 102a is arranged in the peripheral circuit that is connected in series with the memory cell. The bidirectional diode 102b corresponds to the diode of the memory cell M1$ij$ shown in FIG. 20. The fixed resistor 102c refers to, for example, a resistance of a line or the like leading to the peripheral circuit.

The control circuit 409 only has to change a driving condition (the value of the gate voltage) of the transistor 102a to keep constant a total value of load resistances of the nonvolatile memory element 100 overall.

The rewrite information memory circuit 410 in the present embodiment is arranged outside the memory main unit 401.

As described thus far, the nonvolatile memory device 400 in the present embodiment can also keep constant the operating point of the second local region 105b included in the variable resistance element and maintain the approximately constant low-resistance state of the memory cell M1$ij$ (the nonvolatile memory element 100). Moreover, the present method has the effect of causing the changed base resistance Rb (m) and the changed resistance value Rfw of the second local region to be close to the initial resistance values, thereby implementing the nonvolatile memory device having the excellent endurance characteristics.

[Variations of Embodiments]

(1) The above embodiments describe, as an example, the case where the first metal included in the first metal oxide and the second metal included in the second metal oxide are tantalum (Ta). However, this is not intended to be limiting.

As the first metal and the second metal, the following may be used instead of tantalum (Ta): transition metals, such as titanium (Ti), hafnium (Hf), zirconium (Zr), niobium (Nb), and tungsten (W); and metals such as aluminum (Al).

Suppose that a hafnium oxide is used. Therefore, also suppose that a composition of the first metal oxide included in a high oxygen-deficiency layer (the first oxide layer 104a) is represented by HfO$_x$, and that a composition of the second metal oxide included in a low oxygen-deficiency layer (the second oxide layer 104b) is represented by HfO$_y$. In this case, $0.9 \leq x \leq 1.6$ and $1.8 < y < 2.0$ may be satisfied.

Suppose that a zirconium oxide is used. Therefore, also suppose that a composition of the first metal oxide included in a high oxygen-deficiency layer is represented by ZrO$_x$, and that a composition of the second metal oxide included in a low oxygen-deficiency layer is represented by ZrO$_y$. In this case, $0.9 \leq x \leq 1.4$ and $1.9 < y < 2.0$ may be satisfied.

(2) Moreover, the above embodiments describe, as an example, the case where the first metal and the second metal are of the same kind of metal. However, a different kind of metal may be used for each of the first metal and the second metal.

In this case, a standard electrode potential of the second metal may be lower than a standard electrode potential of the first metal. This is because a resistance change phenomenon is assumed to occur when an oxidation-reduction reaction takes place in a tiny filament (conductive path) formed in the local region 105 of the second metal oxide included in the low oxygen-deficiency layer having high resistance and the resistance value accordingly changes.

For example, a stable resistance change operation can be implemented, by using an oxygen-deficient tantalum oxide for the first metal oxide and using a titanium oxide (TiO$_2$) for the second metal oxide. Titanium (the standard electrode potential=−1.63 eV) is a material that is lower in the standard electrode potential than tantalum (the standard electrode potential=−0.6 eV). With this configuration, when the voltage is applied to the variable resistance element 101, most of the voltage is applied to the low-oxygen-deficient layer having the low oxygen deficiency level and the higher resistance value. Moreover, abundant oxygen contributed to reaction is present at a position closer to an interfacial surface between the second electrode 106 and the low oxygen-deficiency layer. On account of this, an oxidation-reduction reaction selectively occurs at the position closer to the interfacial surface between the second electrode 106 and the low oxygen-deficiency layer. As a result, a stable resistance change can be implemented.

A permittivity of the low oxygen-deficiency layer may be higher than a permittivity of the high oxygen-deficiency layer. For example, a titanium oxide TiO$_2$ (relative permittivity=95) is a material that is higher in the relative permittivity than a tantalum oxide Ta$_2$O$_5$ (relative permittivity=26). Moreover, a band gap of the high oxygen-deficiency layer may be smaller than a band gap of the low oxygen-deficiency layer. A titanium oxide TiO$_2$ (band gap=3.1 eV) is a material that is smaller in the band gap than a tantalum oxide Ta$_2$O$_5$ (band gap=4.4 eV). In general, a material having a higher relative permittivity is broken down more easily than a material having a lower relative permittivity. Moreover, a material having a smaller band gap is broken down more easily than a material having a larger band gap. For this reason, in the case of such a material, the initial breakdown voltage can be set low. Thus, the materials used for the first metal oxide and the second metal oxide may be selected to satisfy: that the permittivity of the low oxygen-deficiency layer is higher than the permittivity of the high oxygen-deficiency layer; that the band gap of the high oxygen-deficiency layer is smaller than the band gap of the low oxygen-deficiency layer; or both of these conditions. As a result, a breakdown field strength of the low oxygen-deficiency layer is smaller than a breakdown field strength of the high oxygen-deficiency layer, and the initial breakdown voltage can be reduced. This is because the breakdown field strength and permittivity of a metal oxide layer have a correlation where when the permittivity is higher, the breakdown field strength is smaller, as shown in FIG. 1 by J. McPherson et al., IEDM 2002, P. 633 to 636 (non-patent literature).

(3) Each of the high oxygen-deficiency layer and the low oxygen-deficiency layer may only have to include, as a main variable resistance layer to cause a resistance change, an oxide layer comprising tantalum, hafnium, or zirconium or an oxide layer comprising aluminum. Besides this, each of the high oxygen-deficiency layer and the low oxygen-deficiency layer may include, for example, a different trace element. It is also possible to intentionally include a small amount of a different trace element by, for example, making a fine adjustment to the resistance value. Such a case is also included in the scope of the present invention. For example, when nitrogen is added to the variable resistance layer, the resistance value of the variable resistance layer increases. As a result, the reactivity in the resistance change can be improved.

When a resistance film is formed by sputtering, a trace element may sometimes be present unintentionally in the resistance film due to residual gas or gas release from a wall of a vacuum container. It should be obvious that the case where such a trace element is present in the resistance film is included in the scope of the present invention as well.

(4) The above embodiments describe, as an example, the case where the low-resistance write operation in Step S202 in Operation Example 1 to Operation Example 4 is performed as the normal operation. However, the low-resistance write operation may be performed specially for optimization (when the address signal and the control signal shown in FIG. 19 and FIG. 20 are not received).

The method of driving the nonvolatile memory element and the nonvolatile memory device according to the present invention have been described by way of the above embodiments, it should be obvious that the present invention is not limited to the embodiments described above. Other embodiments implemented through various changes and modifications conceived by a person of ordinary skill in the art may be included in the scope in an aspect or aspects according to the present invention, unless such changes and modifications depart from the scope of the present invention. Moreover, the structural elements in different embodiments described above may be combined as long as such combination does not depart from the scope of the present invention.

[Industrial Applicability]

The method of driving the nonvolatile memory element according to the present invention is useful as, for example, a method of driving a nonvolatile memory element included in a nonvolatile memory device to be used in various kinds of electronic apparatuses, such as a personal computer and a mobile phone.

[Reference Signs List]
100 Nonvolatile memory element
101 Variable resistance element
102 Current steering element
102a Transistor
102b Bidirectional diode
102c Fixed resistor
103 First electrode
104 Variable resistance layer
104a First oxide layer
104b Second oxide layer
105 Local region
105a First local region
105b Second local region
106 Second electrode
310, 401 Memory main unit
302, 402 Memory cell array
303, 403 Row selection circuit-driver
304 Column selection circuit
307, 407 Data input-output circuit
309, 408 Address input circuit
310, 409 Control circuit
320, 400 Nonvolatile memory device
325, 405 Write circuit
326, 406 Sense amplifier
330, 430 Writing power source
340, 410 Rewrite information memory circuit
404 Column selection circuit-driver
Mij Memory cell
M1ij Memory cell
Mhk Selected memory cell
Rij Variable resistance element
Rhk Variable resistance element
Nij Transistor

The invention claimed is:

1. A method of driving a nonvolatile memory element which includes a variable resistance element and a current steering element, the variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer, the current steering element having a transistor connected in series with the variable resistance element, and the method comprising:

setting the variable resistance element to a low resistance state by applying a first gate voltage to a gate of the transistor and applying a first write voltage having a first polarity to the nonvolatile memory element;

setting the variable resistance element to a high resistance state by applying a second gate voltage to the gate of the transistor and applying, to the nonvolatile memory element, a second write voltage having a second polarity different from the first polarity;

changing a resistance value of the transistor that is obtained in the setting of a low resistance state, when a value of current passing through the variable resistance element in the low resistance state or a resistance value of the nonvolatile memory element in a case where the variable resistance element is in the low resistance state is outside a predetermined range; and reading a resistance value of the variable resistance element from a read current passing through the variable resistance element, by applying a read voltage to the variable resistance element after the setting of a low resistance state is performed, wherein the changing includes determining whether or not the resistance value read in the reading is outside the predetermined range.

2. The method of driving the nonvolatile memory element according to claim 1, wherein, in the determining, whether or not an amount of change in the resistance value of the variable resistance element is outside the predetermined range is determined.

3. The method of driving the nonvolatile memory element according to claim 1, wherein the reading and the determining are performed after the setting of a low resistance state is performed a predetermined number of times.

4. The method of driving the nonvolatile memory element according to claim 3,
wherein the determining further includes
calculating an amount of change in the resistance value of the variable resistance element by comparing the resistance value read in the reading with a resistance value previously read in the reading performed before.

5. The method of driving the nonvolatile memory element according to claim 2,
wherein the determining further includes
calculating the amount of change in the resistance value of the variable resistance element by comparing the resistance value read in the reading with a reference resistance value.

6. The method of driving the nonvolatile memory element according to claim 1,
wherein, in the changing, the resistance value of the transistor is changed according to the resistance value read in the reading.

7. A method of driving a nonvolatile memory element which includes a variable resistance element and a current steering element, the variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer, the current steering element having a transistor connected in series with the variable resistance element, and the method comprising:
setting the variable resistance element to a low resistance state by applying a first gate voltage to a gate of the transistor and applying a first write voltage having a first polarity to the nonvolatile memory element;
setting the variable resistance element to a high resistance state by applying a second gate voltage to the gate of the transistor and applying, to the nonvolatile memory element, a second write voltage having a second polarity different from the first polarity; and
changing a resistance value of the transistor that is obtained in the setting of a low resistance state, when a value of current passing through the variable resistance element in the low resistance state or a resistance value of the nonvolatile memory element in a case where the variable resistance element is in the low resistance state is outside a predetermined range,
wherein when (i) the variable resistance element further includes a local region having an outer surface that is in contact with only the second electrode, the first oxide layer, and the second oxide layer and
(ii) the local region includes a first local region and a second local region, the first local region comprising a third metal oxide that is higher in the oxygen deficiency level than the first metal oxide, and the second local region being formed in an area having a surface that is in contact with the second electrode and comprising a fourth metal oxide that is higher in the oxygen deficiency level than the second metal oxide and lower in the oxygen deficiency level than the third metal oxide,
the method further comprises
reading a resistance value of the variable resistance element from a read current passing through the variable resistance element, by applying a read voltage to the variable resistance element after the setting of a low resistance state is performed, and
in the changing, a base resistance including a resistance of the first local region and a resistance of the first oxide layer is calculated based on the resistance value read in the reading, and the resistance value of the transistor is changed according to the calculated base resistance.

8. A method of driving a nonvolatile memory element which includes a variable resistance element and a current steering element, the variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer, the current steering element having a transistor connected in series with the variable resistance element, and the method comprising:
setting the variable resistance element to a low resistance state by applying a first gate voltage to a gate of the transistor and applying a first write voltage having a first polarity to the nonvolatile memory element;
setting the variable resistance element to a high resistance state by applying a second gate voltage to the gate of the transistor and applying, to the nonvolatile memory element, a second write voltage having a second polarity different from the first polarity;
changing a resistance value of the transistor that is obtained in the setting of a low resistance state, when a value of current passing through the variable resistance element in the low resistance state or a resistance value of the nonvolatile memory element in a case where the variable resistance element is in the low resistance state is outside a predetermined range; and
reading a current value of a low-resistance write current passing through the variable resistance element, the reading being performed together with the setting of a low resistance state,
wherein the changing includes determining whether or not the current value read in the reading is outside a predetermined range.

9. The method of driving the nonvolatile memory element according to claim 8,
wherein, in the determining, whether or not an amount of change in the current value read in the reading is outside the predetermined range is determined.

10. The method of driving the nonvolatile memory element according to claim 8,
wherein the reading and the determining are performed after the setting of a low resistance state is performed a predetermined number of times.

11. The method of driving the nonvolatile memory element according to claim 10,
wherein the determining further includes
calculating an amount of change in the current value by comparing the current value read in the reading with a current value previously read in the reading performed before.

12. The method of driving the nonvolatile memory element according to claim 9,
wherein the determining further includes
calculating the amount of change in the current value by comparing the current value read in the reading with a reference current value.

13. The method of driving the nonvolatile memory element according to claim 8,
wherein, in the changing, the resistance value of the transistor is changed according to the current value read in the reading.

14. A method of driving a nonvolatile memory element which includes a variable resistance element and a current steering element, the variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer, the current steering element having a transistor connected in series with the variable resistance element, and the method comprising:

setting the variable resistance element to a low resistance state by applying a first gate voltage to a gate of the transistor and applying a first write voltage having a first polarity to the nonvolatile memory element;

setting the variable resistance element to a high resistance state by applying a second gate voltage to the gate of the transistor and applying, to the nonvolatile memory element, a second write voltage having a second polarity different from the first polarity; and changing a resistance value of the transistor that is obtained in the setting of a low resistance state, when a value of current passing through the variable resistance element in the low resistance state or a resistance value of the nonvolatile memory element in a case where the variable resistance element is in the low resistance state is outside a predetermined range, wherein, in the changing, the resistance value of the transistor is changed according to a correlation stored in advance, the correlation being between (i) the value of the current passing through the variable resistance element in the low resistance state or the resistance value of the nonvolatile memory element in the case where the variable resistance element is in the low resistance state and (ii) the resistance value of the transistor.

15. The method of driving the nonvolatile memory element according to claim 1,
wherein, in the changing, the resistance value of the transistor is changed to cause the value of the current passing through the variable resistance element in the low resistance state or the resistance value of the nonvolatile memory element in the case where the variable resistance element is in the low resistance state to approach the predetermined range.

16. The method of driving the nonvolatile memory element according to claim 1,
wherein the changing is performed after the setting of a low resistance state is performed a predetermined number of times.

17. The method of driving the nonvolatile memory element according to claim 1,
wherein, in the changing, the resistance value of the transistor is changed by changing the first gate voltage.

18. The method of driving the nonvolatile memory element according to claim 1,
wherein a second metal included in the second metal oxide and a first metal included in the first metal oxide are the same kind of metal.

19. The method of driving the nonvolatile memory element according to claim 18,
wherein each of the first metal and the second metal is tantalum (Ta).

20. The method of driving the nonvolatile memory element according to claim 1,
wherein the current steering element includes a diode and a fixed resistor at least one of which is connected in series with the transistor.

21. A nonvolatile memory device comprising:
a variable resistance element having a first electrode, a first oxide layer arranged on the first electrode and comprising a first metal oxide, a second oxide layer arranged to be in contact with the first oxide layer and comprising a second metal oxide that is lower in an oxygen deficiency level than the first metal oxide, and a second electrode arranged on the second oxide layer;
a current steering element having a transistor connected in series with the variable resistance element;
a write voltage application circuit which executes (i) a low-resistance write operation by applying a first gate voltage to a gate of the transistor and applying a first write voltage having a first polarity to the nonvolatile memory element and (ii) a high-resistance write operation by applying a second gate voltage to the gate of the transistor and applying, to the nonvolatile memory element, a second write voltage having a second polarity different from the first polarity; and
a control circuit which changes a resistance value of the transistor that is obtained in the low-resistance write operation, when a value of current passing through the variable resistance element in the low resistance state or a resistance value of the nonvolatile memory element in a case where the variable resistance element is in the low resistance state is outside a predetermined range.

\* \* \* \* \*